(12) United States Patent
Overall et al.

(10) Patent No.: US 10,641,857 B2
(45) Date of Patent: May 5, 2020

(54) METHODS FOR OPTIMAL GRADIENT DESIGN AND FAST GENERIC WAVEFORM SWITCHING

(71) Applicant: HEARTVISTA, INC., Los Altos, CA (US)

(72) Inventors: William Overall, Los Altos, CA (US); Juan Santos, Los Altos, CA (US)

(73) Assignee: HeartVista, Inc., Los Altos, CA (US)

( * ) Notice: Subject to any disclaimer, the term of this patent is extended or adjusted under 35 U.S.C. 154(b) by 1208 days.

(21) Appl. No.: 14/640,685

(22) Filed: Mar. 6, 2015

(65) Prior Publication Data
US 2015/0212179 A1    Jul. 30, 2015

Related U.S. Application Data

(63) Continuation of application No. PCT/US2013/021077, filed on Jan. 10, 2013.
(Continued)

(51) Int. Cl.
*G01R 33/54*     (2006.01)
*G01R 33/385*   (2006.01)
(Continued)

(52) U.S. Cl.
CPC ..... *G01R 33/5608* (2013.01); *G01R 33/3852* (2013.01); *G01R 33/4822* (2013.01);
(Continued)

(58) Field of Classification Search
USPC .......................... 324/300–322; 600/407–435
See application file for complete search history.

(56) References Cited

U.S. PATENT DOCUMENTS

| | | | |
|---|---|---|---|
| 4,307,343 A | 12/1981 | Likes | |
| 5,349,296 A * | 9/1994 | Cikotte | G01R 33/54 324/309 |

(Continued)

FOREIGN PATENT DOCUMENTS

| | | |
|---|---|---|
| WO | WO-2004042656 A1 | 5/2004 |
| WO | WO-2014039080 A1 | 3/2014 |

OTHER PUBLICATIONS

Albert, et al. Susceptibility changes following bolus injections. Magn Reson Med. 1993;29:700-708.
(Continued)

*Primary Examiner* — Melissa J Koval
*Assistant Examiner* — Tiffany A Fetzner
(74) *Attorney, Agent, or Firm* — Wilson Sonsini Goodrich and Rosati, P.C.

(57) ABSTRACT

This disclosure provides a computer-implemented method for sequencing magnetic resonance imaging waveforms using a multistage sequencing hardware. The method comprises creating, with the aid of a computer processor, an active memory region that includes waveforms and schedules being played, and creating one or more buffer memory regions that contain waveforms and schedules not currently being played. Next, the waveforms and schedules in the one or more buffer memory regions may be updated while waveforms may be played in the active memory region. Upon completion of the waveform playback in the active memory region, the active and buffer memory regions may be swapped so that the former buffer memory region becomes the active memory region, and the former active memory region becomes the buffer memory region. The method may be repeated as needed until the imaging process is completed or otherwise halted.

10 Claims, 10 Drawing Sheets

Related U.S. Application Data

(60) Provisional application No. 61/698,522, filed on Sep. 7, 2012, provisional application No. 61/698,504, filed on Sep. 7, 2012.

(51) Int. Cl.
    *G01R 33/48*     (2006.01)
    *G01R 33/56*     (2006.01)
    *G01R 33/561*    (2006.01)

(52) U.S. Cl.
    CPC ......... *G01R 33/543* (2013.01); *G01R 33/561* (2013.01); *G01R 33/4824* (2013.01)

(56) References Cited

U.S. PATENT DOCUMENTS

| | | | | |
|---|---|---|---|---|
| 5,465,361 | A | * | 11/1995 | Hoenninger, III ........ G06F 8/54 324/309 |
| 5,512,825 | A | | 4/1996 | Atalar et al. |
| 5,758,646 | A | | 6/1998 | Van Der Meulen et al. |
| 6,008,648 | A | | 12/1999 | Linz et al. |
| 6,020,739 | A | | 2/2000 | Meyer et al. |
| 6,198,282 | B1 | | 3/2001 | Dumoulin |
| 6,566,877 | B1 | | 5/2003 | Anand et al. |
| 6,801,037 | B1 | * | 10/2004 | Zhang ..................... G01R 33/54 324/309 |
| 6,937,015 | B2 | * | 8/2005 | Heid ....................... G01R 33/54 324/307 |
| 7,053,614 | B2 | | 5/2006 | Hornung |
| 7,078,899 | B2 | * | 7/2006 | Dale ....................... G01R 33/54 324/307 |
| 7,081,750 | B1 | * | 7/2006 | Zhang ..................... G01R 33/54 324/309 |
| 7,102,349 | B2 | | 9/2006 | Hornung |
| 7,301,341 | B2 | | 11/2007 | Hargreaves et al. |
| 7,791,338 | B2 | * | 9/2010 | Kim ....................... G01R 33/561 324/307 |
| 9,167,987 | B2 | * | 10/2015 | Mori ................... G01R 33/5673 |
| 9,645,216 | B2 | * | 5/2017 | Heismann ............ G01R 33/543 |
| 2005/0077895 | A1 | | 4/2005 | Hargreaves et al. |
| 2007/0265522 | A1 | | 11/2007 | Kassai et al. |
| 2008/0021304 | A1 | | 1/2008 | Stemmer |
| 2008/0114234 | A1 | | 5/2008 | Gering |
| 2008/0183067 | A1 | | 7/2008 | Shu et al. |
| 2009/0069664 | A1 | * | 3/2009 | Kim ....................... G01R 33/561 600/410 |
| 2009/0275822 | A1 | | 11/2009 | Detsky et al. |
| 2009/0317335 | A1 | | 12/2009 | Lin et al. |
| 2010/0121178 | A1 | | 5/2010 | Krishnan et al. |
| 2010/0198050 | A1 | * | 8/2010 | Mori ....................... A61B 5/055 600/413 |
| 2010/0308829 | A1 | | 12/2010 | Vu et al. |
| 2011/0006768 | A1 | | 1/2011 | Ying et al. |
| 2011/0234227 | A1 | | 9/2011 | Weiger Senften et al. |
| 2012/0086449 | A1 | * | 4/2012 | Graesslin ............. G01R 33/285 324/309 |
| 2013/0200893 | A1 | * | 8/2013 | Heismann .......... G01R 33/3854 324/314 |
| 2013/0274592 | A1 | | 10/2013 | Shin et al. |
| 2015/0212179 | A1 | * | 7/2015 | Overall ................ G01R 33/543 324/309 |
| 2018/0120401 | A1 | * | 5/2018 | Shin ................... G01R 33/4826 |

OTHER PUBLICATIONS

Dewey, et al. Myocardial viability: assessment with three-dimensional MR imaging in pigs and patients. Radiology. Jun. 2006;239(3):703-9. Epub Apr. 26, 2006.

Foo, et al. Myocardial viability: Breath-hold 3d mr imaging of delayed hyperenhancement with variable sampling in time. Radiology. 2004;230:845-851.

Gottlieb, et al. Magnetic resonance imaging in the evaluation of non-ischemic cardiomyopathies: current applications and future perspectives. Heart Fail Rev. Dec. 2006;11(4):313-23.

Griswold, et al. Generalized autocalibrating partially parallel acquisitions (grappa). Magn Reson Med. 2002;47:1202-1210.

Heberlein, et al. Auto-calibrated parallel spiral imaging. Magn Reson Med. Mar. 2006;55(3):619-25.

Heidary, et al. Quantitative tissue characterization of infarct core and border zone in patients with ischemic cardiomyopathy by magnetic resonance is associated with future cardiovascular events. J Am Coll Cardiol. 2010;55:2762-2768.

Hunold, et al. Myocardial late enhancement in contrast-enhanced cardiac MRI: distinction between infarction scar and non-infarction-related disease. AJR Am J Roentgenol. May 2005;184(5):1420-6.

Irarrazabal, et al. Inhomogeneity correction using an estimated linear field map. Magn Reson Med. 1996;35:278-282.

Jerosch-Herold, et al. Magnetic resonance quantification of the myocardial perfusion reserve with a fermi function model for constrained deconvolution. Med Phys. 1998;25:73-84.

Kim, et al. How we perform delayed enhancement imaging. J Cardiovasc Magn Reson. 2003;5:505-514.

Kim, et al. Relationship of MRI delayed contrast enhancement to irreversible injury, infarct age, and contractile function. Circulation. Nov. 9, 1999;100(19)1992-2002.

Mahrholdt, et al. Delayed enhancement cardiovascular magnetic resonance assessment of non-ischaemic cardiomyopathies. Eur Heart J. Aug. 2005;26(15):1461-74. Epub Apr. 14, 2005.

Matsumoto, et al. Peri-infarct zone on early contrast-enhanced CMR imaging in patients with acute myocardial infarction. JACC Cardiovasc Imaging. Jun. 2011;4(6):610-8. doi: 10.1016/j.jcmg.2011.03.015.

Michael Lustig and John M. Pauly, SPIRit: Iterative Self-Consistent Parallel Imaging Reconstruction from Arbitrary k-space, Aug. 2010, Magnetic Resonance in Medicine, vol. 64, Issue 2, pp. 457-471.

Mischi, et al. On the physical and stochastic representation of an indicator dilution curve as a gamma variate. Physiol Meas. 20080;29:281-294.

Nguyen, et al. A fast navigator-gated 3D sequence for delayed enhancement MRI of the myocardium: comparison with breathhold 2D imaging. J Magn Reson Imaging. Apr. 2008;27(4):802-8. doi: 10.1002/jmri.21296.

Office action dated Apr. 10, 2015 for U.S. Appl. No. 13/780,395.
Office action dated Aug. 4, 2016 for U.S. Appl. No. 13/780,395.
Office action dated Oct. 22, 2014 for U.S. Appl. No. 13/780,395.
Office action dated Nov. 5, 2015 for U.S. Appl. No. 13/780,395.

Oshinski, et al. Imaging time after Gd-DTPA injection is critical in using delayed enhancement to determine infarct size accurately with magnetic resonance imaging. Circulation. Dec. 4, 2001;104(23):2838-42.

Pluim, et al. Mutual-information-based registration of medical images: A survey. IEEE Trans Med Imaging. 2003;22:986-1004.

Saranathan, et al. Fast, three-dimensional free-breathing MR imaging of myocardial infarction: a feasibility study. Magn Reson Med. May 2004;51(5):1055-60.

Schmidt, et al. Infarct tissue heterogeneity by magnetic resonance imaging identifies enhanced cardiac arrhythmia susceptibility in patients with left ventricular dysfunction. Circ. 2007;115:2006-2014.

Simonetti, et al. An improved MR imaging technique for the visualization of myocardial infarction. Radiology. Jan. 2001;218(1):215-23.

Syed, et al. Role of cardiac magnetic resonance imaging in the detection of cardiac amyloidosis. JACC Cardiovasc Imaging. Feb. 2010;3(2):155-64. doi: 10.1016/j.jcmg.2009.09.023.

Vogel-Claussen, et al. Delayed enhancement mr imaging: Utility in myocardial assessment. Radiographics. 2006;26:795-810.

Warntjes, et al. Rapid t1 quantification based on 3d phase sensitive inversion recovery. BMC Med Imaging. 2010;10:19.

Yan, et al. Characterization of the peri-infarct zone by contrast-enhanced cardiac magnetic resonance imaging is a powerful predictor of post-myocardil infarction mortality. Circ. 2006;114:32-39.

International preliminary report on patentability dated Aug. 14, 2013 for PCT Application No. US2013/021077.

(56) References Cited

OTHER PUBLICATIONS

International search report and written opinion dated Aug. 14, 2013 for PCT Application No. US2013/021077.
Ljunggren, S. A Simple Graphical Representation of Fourier-Based Imaging Methods. Journal of Magnetic Resonance 54, 338-343, 1983.
IEC. International Standard. IEC 60601-2-33; Edition 3.0; Mar. 2010; 108 pages.
Office Action dated Jun. 7, 2017 for U.S. Appl. No. 13/780,395.

* cited by examiner

600
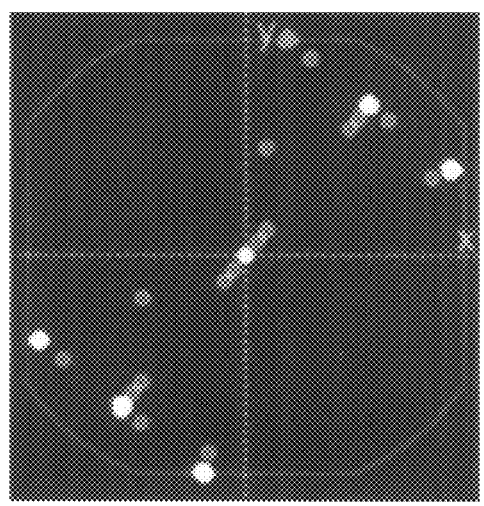
Selected Point: 100.00%
Maximum: 100.00%
Average: 92.86%
Gz
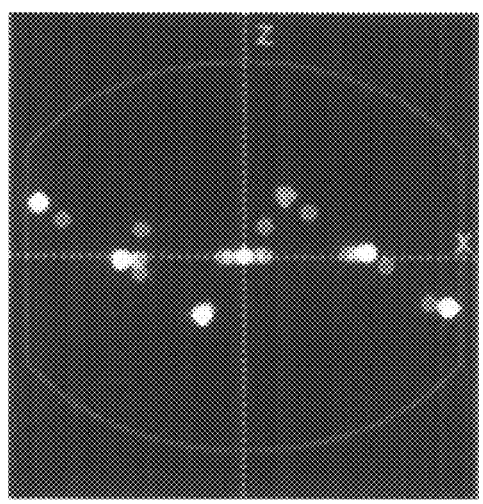 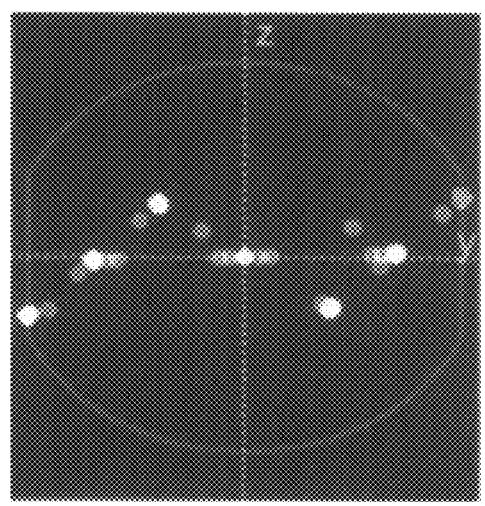
Gy                              Gx
*FIG. 6*

System
1000

METHODS FOR OPTIMAL GRADIENT DESIGN AND FAST GENERIC WAVEFORM SWITCHING

CROSS-REFERENCE

This application is a continuation of PCT/US2013/021077 filed on Jan. 10, 2013, which claims the benefits of U.S. Provisional Patent Application No. 61/698,522, filed Sep. 7, 2012, and U.S. Provisional Patent Application No. 61/698,504, filed Sep. 7, 2012, the full disclosures of which are entirely incorporated herein by reference.

STATEMENT AS TO FEDERALLY SPONSORED RESEARCH

This invention was made with the support of the United States government under contract numbers R44HL084769 and R44HL092691 by the National Institutes of Health. The government has certain rights in the invention.

BACKGROUND

The present disclosure relates generally to medical devices and methods. Although specific reference is made to magnetic resonance imaging (MRI), the methods and apparatus described herein can be used with many medical imaging and diagnostic procedures and apparatuses.

Magnetic resonance imaging (MRI) relies on the principles of nuclear magnetic resonance (NMR). In MRI, an object to be imaged is placed in a uniform magnetic field ($B_0$), subjected to a limited-duration magnetic field ($B_1$) perpendicular to $B_0$, and then signals are detected as the "excited" nuclear spins in the object "relax" back to their equilibrium alignment with $B_0$ following the cessation of $B_1$. Through the application of additional magnetic fields ("gradients") to the imaging process, detected signals can be spatially localized in up to three dimensions.

MRI of living subjects generally makes use of water protons found in tissues. In a typical imaging setup, a subject may then be first placed in a uniform magnetic field ($B_0$), where the individual magnetic moments of the water protons in the subject's various tissues align along the axis of $B_0$ and precess about it at the so-called Larmor frequency. The imaged subject may then be exposed to a limited-duration "excitation" magnetic field ($B_1$, generally created by application of a radio-frequency (RF) "pulse") perpendicular to $B_0$ and at the Larmor frequency, where the net aligned magnetic moment (the sum of all individual proton moments aligned with $B_0$) at equilibrium, $m_0$, is temporarily rotated, or "tipped" toward the plane corresponding to $B_1$ (the "transverse" plane). This results in the formation of a net moment, $m_t$, in the transverse plane. After cessation of $B_1$, a signal may be recorded from $m_t$ as it "relaxes" back to $m_0$. The local magnetic field environment of each tissue affects $m_t$ relaxation rates uniquely, resulting in tissue differentiation on images. Moreover, magnetic field gradients are typically employed in order to spatially localize the signals recorded from $m_t$. The excitation/gradient application/signal readout process, a so-called "pulse sequence", may be performed repetitively in order to achieve appropriate image contrast. The resulting set of received signals may then be processed with reconstruction techniques to produce images useful to the end-user.

Advances in the field of Magnetic Resonance Imaging (MRI), such as gradient hardware, high field systems, optimized receiver coil arrays, fast sequences and sophisticated reconstruction methods, provide the ability to perform rapid MRI imaging. In at least some instances, however, the capabilities of an MRI machine may be limited by memory capacity and processing speed. Improved methods and apparatuses for performing rapid MRI imaging, particularly in a memory and processing power limited MRI machine, are therefore desired.

Time-efficient production of time-optimal gradient waveforms that comply with safety and hardware gradient rate-of-change limitations is generally recognized as an important challenge for real-time MRI. While other methods may adequately calculate time-efficient gradient waveforms that conform to hardware and safety rate-of-change limitations, they may take many minutes to compute, and may render them unusable for real-time imaging. Thus, improved methods and apparatuses for providing more time-efficient gradient waveforms that conform to hardware and safety rate-of-change limitations in MRI machines are desired.

SUMMARY

In an aspect, this disclosure provides a method that generates time-efficient linear magnetic field gradient waveforms that may produce magnetic field gradient pulses that come within 10% or better of the regulatory and/or hardware limit and may need only milliseconds to compute is provided. Moreover, the method may also be extended to design of specific k-space trajectories, non-linear magnetic field gradients, and new pulse sequence applications such as the optimization method of the disclosure, where the gradient area, moment, and start/end amplitudes may be the desired input parameters.

This disclosure provides systems and methods for graphically or programmatically creating pulse sequences based upon parameters relevant to the MRI pulse-sequence designer are provided. Many current magnetic resonance imaging (MRI) scanners require the pulse-sequence designer to independently determine and design the shapes of gradient waveforms that meet certain desired requirements, and only provide certain primitive structures such as trapezoids and ramps to help accomplish this design. Typically, an MRI pulse-sequence designer desires a certain gradient area and/or moment to be realized on one or more gradient axes, with given start and end amplitudes, rather than be interested in the specific shape of the waveform for most applications. Matching design tools to these user needs can greatly improve the ability to design new MRI acquisition strategies with a minimum of designer effort and time.

Real-time MRI may also require that sets of arbitrary waveforms and playback schedules be rapidly uploaded into a piece of dedicated magnetic resonance (MR) sequencing hardware that may be limited in processing power and/or available memory. Parameters of these waveforms such as their durations, amplitudes, data points, and number may all change arbitrarily and may not be known ahead of time.

This disclosure also provides a method for generating magnetic field gradients used in magnetic resonance imaging (MRI). With the aid of a computer processor, a set of gradient parameters is geometrically transformed from a physical gradient space into a geometrically transformed space (e.g., with at least one of a rotative transformation, a proportional transformation, a magnitude transformation, etc.). With the aid of a computer processor, a set of separable gradient waveforms that satisfy a set of gradient rate-of-change constraints in the geometrically transformed space is calculated. The set of gradient parameters may contain parameters that include a gradient start magnitude, gradient end magnitude, gradient amplitude, gradient first moment, and higher-order gradient moments. At least two of these parameters may typically be used. The set of rate-of-change constraints may comprise one or more of a physical hardware constraint and a regulatory safety constraint. The geometric transforming and calculating steps are repeated until the gradient waveforms in the set of separable gradient waveforms are of substantially the same time length. This step of repetition may be a nonlinear solution method. With the aid of a computer processor, the resulting gradient set of waveforms of substantially the same time length is geometrically transformed back into the physical gradient space.

This disclosure also provides methods for rapidly and efficiently uploading arbitrary waveforms and playback schedules into a piece of sequencer hardware (e.g., MRI hardware) at any point, including during sequence execution, while minimizing playback time, system processing, and data storage requirements. When schedules are created in this way, preparation processing time can be reduced from many seconds to milliseconds or less. When preparation times cross the important threshold of requiring roughly less processing time than about the sequence repetition time (TR), which may be as short as a few milliseconds, sequences can be prepared just-in-time during sequence execution. This just-in-time sequence preparation enables true real-time manipulation of the imaging acquisition in arbitrary ways with little perceptible latency between action and reaction. Moreover, memory requirements for alternative schedules can be reduced by an order of magnitude through storing only the current and next iterations at any given time.

For example, a method for sequencing waveforms used in magnetic resonance imaging (MRI) may be provided. An active memory region and on or more buffer memory regions in a computer-readable medium are provided. The active memory region comprises one or more waveforms and schedules being played while the one or more buffer regions comprise one or more waveforms and schedules not currently being played. With the aid of a computer processor, the one or more waveforms and schedules not currently being played in the one or more buffer memory regions are updated while the one or more waveforms and schedules of the active memory region are being played. Upon the completion of the waveform playback in the active memory region, the active memory region and the buffer memory region are swapped with the aid of a computer processor. This swapping may occur without sequencer inactivity or delay. These steps are repeated until the imaging process is complete.

The waveforms of the active memory region and the one or more buffer regions may comprise at least one gradient waveform, RF channel waveform, shim waveform, field waveform, or acoustic waveform. The schedules of the active memory region and the one or more buffer regions may comprise pointers to at least one waveform region, duration, amplitude, or delay interval. The waveform playback may comprise a time interval per iteration which may vary from one iteration to another.

Updating the one or more waveforms and schedules not being played in the one or more buffer memory regions may comprise two or more steps. The one or more waveforms and schedules not being played are subdivided into one or more blocks that represent sequencing regions that are independently modifiable. Real-time changes are performed on individual blocks. Such real-time changes comprise one or more of scaling, rotation, enabling, and disabling.

This disclosure also provides a method for permitting real-time changes to waveforms used in magnetic resonance imaging (MRI). A time interval is subdivided into one or more blocks that represent sequencing regions that are independently modifiable. Real-time changes are performed on individual blocks. Such real-time changes comprise one or more of scaling, rotation, enabling, and disabling.

This disclosure also provides a method of generating a waveform used in imaging applications. A first combined constraint for an imaging device is determined by calculating, with the aid of a computer processor, an intersection between a first multidimensional limitation and a second multidimensional limitation. The first multidimensional limitation may comprise a hardware limitation for an imaging device such as a gradient amplitude limit or a gradient slew rate limit. The gradient amplitude or slew-rate limit may be calculated as a peak or as a root-mean-square limit. The second multidimensional limitation may comprise a regulatory limitation for an imaging device such as a maximum safe rate of change for a magnetic field for a scan subject. The regulatory limitation may comprise a maximum safe rate of change of a magnetic field for a scan subject in the presence of an implantable or interventional medical device. A set of desired gradient properties is provided. These gradient properties may include at least one or two of a starting gradient magnitude, an ending gradient magnitude, a net gradient area, and a higher-order gradient moment. A set of desired multidimensional gradient parameters in a first coordinate space is calculated from the provided set of desired gradient properties. The calculated set of desired multidimensional gradient parameters is geometrically transformed into a second coordinate space. A second combined constraint for the imaging device is determined by calculating an intersection between the first combined constraint and the geometrically transformed set of desired multidimensional gradient parameters. A multidimensional set of gradient waveforms that satisfy the second combined constraint is calculated. The multidimensional set of gradient waveforms will comprise a first waveform in a first axis, a second waveform in a second axis, and often also a third waveform in a third axis. It is then determined whether the first waveform, second waveform, and often the third waveform have the same time length. If the waveforms have the same time length, the multidimensional set of gradient waveforms is geometrically transformed back into the first coordinate space. If the waveforms do not have the same time length, many of the above steps may be repeated until they do. A magnetic field gradient pulse for a Magnetic Resonance Imaging (MRI) device or scanner can then be generated based on the geometrically transformed multidimensional set of gradient waveforms.

This disclosure also provides a method of generating waveforms used in an imaging application. A first imaging waveform is generated based on a first waveform schedule read from a first memory region in a computer readable medium. A second waveform schedule in a second memory region in the computer readable medium is updated while the first imaging waveform is being generated. A second imaging waveform is generated based on the second waveform schedule read from the second memory region after the first imaging waveform has finished being generated. The first imaging waveform schedule in the first memory region is updated while the second imaging waveform is being generated. The first waveform schedule and the second waveform schedule may be comprised of least one gradient waveform, RF channel waveform, shim waveform, field waveform, or acoustic waveform. The first waveform schedule and the second waveform schedule may comprise pointers to at least one waveform region, duration, amplitude, or delay interval. The time interval for generating the first imaging waveform may be the same as the time interval for generating the second imaging waveform. There may be no time delay between generating the first imaging waveform and generating the second imaging waveform.

This disclosure also provides a computer-readable medium comprising code which, when executed by a computer processor, executes a method. In a first step of this method, a set of gradient parameters from a physical gradient space is geometrically transformed, with the aid of a computer processor, into a geometrically transformed space (e.g., with at least one of a rotative transformation, a proportional transformation, a magnitude transformation, etc.). In a second step, a set of separable gradient waveforms that satisfy a set of gradient rate-of-change constraints in said geometrically transformed space is calculated, with the aid of a computer processor. In a third step, the first and second steps are repeated until the gradient waveforms in said set of separable gradient waveforms are of substantially the same time length. In a fourth step, a resulting gradient set of waveforms of substantially the same time length is geometrically transformed, with the aid of a computer processor, back into said physical gradient space.

This disclosure also provides a computer-readable medium comprising code which, when executed by a computer processor, executes a method. In a first step, an active memory region in a memory location of a computer system programmed to sequence MRI waveforms is provided. The active memory region comprises one or more waveforms and schedules being played. In a second step, one or more buffer memory regions in the memory location is provided. The one or more buffer regions comprise one or more waveforms and schedules not currently being played. In a third step, the one or more waveforms and schedules not currently being played in said one or more buffer memory regions is updated, with the aid of a computer processor of said computer system, while said one or more waveforms and schedules of said active memory region are being played. In a fourth step, said active memory region is swapped with said buffer memory region with the aid of a computer processor upon completion of the waveform playback in said active memory region.

This disclosure also provides a computer-readable medium comprising code which, when executed by a computer processor, executes a method. In a first step of the method, a time interval of a magnetic resonance imaging waveform is subdivided, with the aid of a computer processor, into one or more blocks that represent sequencing regions that are independently modifiable. In a second step, real-time changes are performed on individual blocks. The real-time changes comprise one or more of scaling, rotation, enabling, and disabling.

This disclosure also provides a computer-readable medium comprising code which, when executed by a computer processor, executes a method. In a first step of the method, a first imaging waveform is generated based on a first waveform schedule read from a first memory region of a memory location of a computer system programmed to generate waveforms. In a second step, a second waveform schedule in a second memory region in a memory location is updated while the first imaging waveform is being generated. In a third step, a second imaging waveform is generated based on the second waveform schedule read from the second memory region when the first imaging waveform has been generated. In a fourth step, the first imaging waveform schedule in the first memory region is updated.

This disclosure also provides a system for generating magnetic field gradients for use in magnetic resonance imaging (MRI). The system comprises a computer processor and a memory location coupled to the computer processor. The memory location comprises code which, when executed by said computer processor, implements a method. In a first step of this method, a set of gradient parameters is geometrically transformed, with the aid of a computer processor, from a physical gradient space into a geometrically transformed space (e.g., with at least one of a rotative transformation, a proportional transformation, a magnitude transformation, etc.). In a second step, a set of separable gradient waveforms that satisfy a set of gradient rate-of-change constraints in said geometrically transformed space is calculated, with the aid of a computer processor. In a third step, the first and second steps are repeated until the gradient waveforms in said set of separable gradient waveforms are of substantially the same time length. In a fourth step, a resulting gradient set of waveforms of substantially the same time length is geometrically transformed back into said physical gradient space.

This disclosure also provides a system for sequencing waveforms for use in magnetic resonance imaging (MRI). The system comprises a computer processor and a memory location coupled to the computer processor. The memory location comprises code which, when executed by said computer processor, implements a method. In a first step of this method, an active memory region in a memory location of a computer system programmed to sequence MRI waveforms is provided. The active memory region comprises one or more waveforms and schedules being played. In a second step, one or more buffer memory regions in the memory location is provided. The one or more buffer regions comprise one or more waveforms and schedules not currently being played. In a third step, the one or more waveforms and schedules not currently being played in said one or more buffer memory regions is updated, with the aid of a computer processor of said computer system, while said one or more waveforms and schedules of said active memory region are being played. In a fourth step, the active memory region is swapped with the buffer memory region upon completion of the waveform playback, with the aid of a computer processor.

This disclosure also provides a system for permitting real-time changes to waveforms used in magnetic resonance imaging (MRI). The system comprises a computer processor and a memory location coupled to the computer processor. The memory location comprising code which, when executed by said computer processor, implements a method. In a first step of the method, a time interval of a magnetic resonance imaging waveform is subdivided, with the aid of a computer processor, into one or more blocks that represent sequencing regions that are independently modifiable. In a second step, real-time changes on individual blocks are performed. These real-time changes comprise one or more of scaling, rotation, enabling, and disabling.

This disclosure also provides a system for generating magnetic field gradients for use in magnetic resonance imaging (MRI). The system comprises a computer processor and a memory location coupled to the computer processor. The memory location comprises code which, when executed by said computer processor, implements a method. In a first step of the method, a set of gradient parameters is geometrically transformed, with the aid of a computer processor, from a physical gradient space into a geometrically transformed space (e.g., with at least one of a rotative transformation, a proportional transformation, a magnitude transformation, etc.). In a second step, a set of separable gradient waveforms that satisfy a set of gradient rate-of-change constraints in said geometrically transformed space is calculated. In a third step, the first and second steps are repeated until the gradient waveforms in said set of separable gradient waveforms are of substantially the same time length. In a fourth step, a resulting gradient set of waveforms of substantially the same time length is geometrically transformed back into said physical gradient space.

This disclosure also provides a system for generating waveforms for use in an imaging application. The system comprises a computer processor and a memory location coupled to the computer processor. The memory location comprises code which, when executed by said computer processor, implements a method. In a first step of the method, a first imaging waveform based on a first waveform schedule read from a first memory region of a memory location of a computer system programmed to generate waveforms is generated. In a second step, a second waveform schedule in a second memory region in a memory location is updated while the first imaging waveform is being generated. In a third step, a second imaging waveform is generated based on the second waveform schedule read from the second memory region when the first imaging waveform has been generated. In a fourth step, the first imaging waveform schedule in the first memory region is updated.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIG. 6 describes the point-wise magnetic field gradient change limits of the waveforms shown in FIG. 5. The average data point is at 93% of the theoretical limit.

DETAILED DESCRIPTION

Figure 1:
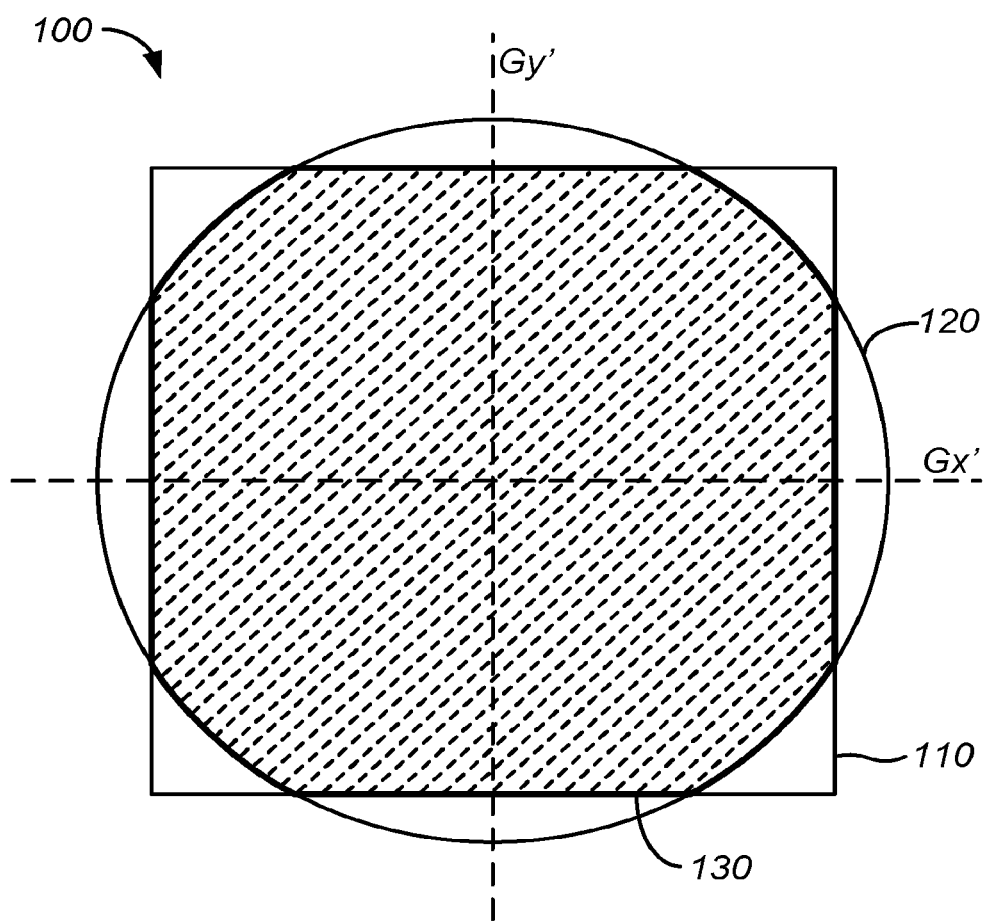
FIG. 1 schematically illustrates a two-dimensional example of the safety and hardware limitations for maximum magnetic field gradient rates-of-change permitted in MRI. The areas where permitted safety and hardware areas overlap represent the space of allowable rates of magnetic field gradient rates-of-change and thus define the maximum range of possible slew rates.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

Gradients used in MRI may be generated by amplifiers that drive coils to produce spatially varying magnetic fields oriented along a set of physical axes fixed to the MRI system geometry. A gradient subsystem may be comprised of three amplifiers and corresponding coils, each set directed along one of three perpendicular axes.

The gradient fields produced by the gradient amplifiers/coils may be defined by "waveforms" (gradient level with respect to time) calculated along three "physical" perpendicular axes by an associated computer. When creating an image, the gradients that are required typically are specified in the coordinate system of the image to be acquired; these perpendicular left-right, up-down, and through-plane image directions can be considered as a second set of "logical" coordinate axes (x', y', z'). These logical axes may not correspond to the physical axes on which the MRI system's gradient amplifiers/coils may be arranged, in order to allow for arbitrary imaging orientations. As a result, each logical gradient waveform may be executed using a combination of one or more of the system's physically oriented gradients, depending on the desired imaging orientation. When a pulse sequence is executed, the logical gradient waveforms may be converted into physical gradient waveforms for driving the gradient amplifiers on the MRI system. Such conversion may be achieved by matrix rotation of the logical gradient waveforms.

The magnetic field gradient subsystem of an MRI system is critical in defining the utility of a scanner. In general, more powerful gradient subsystems may provide greater applications capability. The power of a gradient subsystem may refer to the limits on allowable gradient amplitude, allowable gradient slew rate, or some combination of the two. The gradient amplitude is the magnitude of linear magnetic field variation that the gradient amplifiers produce in the gradient coils (typically expressed in Gauss per centimeter, G/cm), and the gradient slew rate is the rate at which the gradient amplifiers can change the gradient amplitude (typically expressed in G/cm per millisecond, G/cm/ms). For reference, various MRI scanners may be capable of maximum gradient amplitudes between 2 and 5 G/cm, and maximum slew rates between 7 and 25 G/cm/ms.

In at least some circumstances, the attribute of importance in the generation of a gradient field pulse may be the integral of gradient amplitude over the duration of the gradient pulse (i.e., the gradient pulse area). This area may be desirable on either the physical or logical axes, but is most typically specified along logical axes. For example, creating a linear phase distribution in tissues along a certain image axis can be accomplished equivalently through generating a certain gradient area along that axis, roughly regardless of the particular wave shape that was used to generate that area. In other circumstances, the first moment of the pulse over time may also be important (e.g., the integral of the gradient amplitude multiplied by time over the duration of the gradient pulse). This concern for areas and/or gradient moments may be utilized across a wide variety of MRI acquisition techniques, including, for example, slice-select refocusing, phase-encoding, velocity or flow compensation, crushing, spoiling, rewinding and readout defocusing gradient pulses. Since the shortest duration gradient pulse of a given area may provide the greatest flexibility in selecting pulse sequence echo time (TE) and pulse sequence repetition time (TR), it may be desirable for the MRI system to produce these gradient pulses with the minimum pulse duration possible given the prescribed pulse area and/or moment.

Magnetic field gradients may be switched on and off during a pulse sequence to encode different positional information, to prepare magnetization, and to create steady states. Indeed, a large portion of the time required for MRI may include waiting for gradient waveforms to reach specified values (e.g., net area, moments, amplitudes) in the gradient hardware. Thus, the speed at which an MRI image may be produced may directly depend on how quickly gradient waveforms can reach their specified values. Therefore, significant value may exist in computing time-efficient gradient waveforms in a time efficient manner, as it may help to minimize gradient switching times and, thus, the overall speed of image acquisition. Moreover, it may be beneficial to be able to quickly recalculate gradient waveforms, often in response to user inputs, such as selection of a new scan-plane geometry, adjusting image field-of-view, slice thickness, etc.

In addition to magnetic field gradients, other components of a pulse sequence may also be defined by a waveform. These components include, but are not limited to, the RF pulse used to excite nuclear spins and shims used to correct for inhomogeneities in the applied static magnetic field, $B_0$.

After the various waveforms necessary to complete an imaging sequence are computed, they may be properly sequenced. For this process, a schedule (the "scheduler") that accurately assembles the sequence of waveforms and other parameters that may be needed to execute a pulse sequence and a library of pre-determined waveforms may be uploaded into a piece of sequencing hardware (the "sequencer") memory for execution in the respective sub-devices (e.g., gradients, RF coil, etc.) of the MRI system. Sequence events played during a pulse sequence may repeat, repeat with changes, repeat in a cycling manner, or be fairly different from one to the next depending on the pulse sequence(s) used. As an example, a real-time imaging application may desire to update the image field-of-view or RF tip angle dynamically in response to a user request (e.g., by moving the associated sliders in the user interface). The full gamut of such changes could not be anticipated ahead-of-time, and the waveforms and sequencer must be updated, the new sequence played, and the data must be reconstructed and displayed all within hundreds of milliseconds in order for the user to perceive a responsive, low-latency user interface.

In current implementations known in the art, sequencer changes may only occur at regular intervals during certain serial "dead-time" portions of the pulse sequence, where scheduler playback may not occur. Such a serial approach may introduce inefficiency into a pulse sequence, as a period of sequencer inactivity may be required for proper playback, and the number of allowable changes per interval may be limited by the duration of the dead period. Moreover, any additional waveforms not known prior to the start of sequence execution and, thus, not included in the uploaded library may also require additional dead-periods for additional waveform uploading. It should also be noted that in cases where sequencing occurs only during a dead-period, the flexibility of the sequencer to appropriately implement any unexpected waveform changes in real-time is limited.

This disclosure provides systems and methods for improving the performance of magnetic resonance imaging (MRI) systems. The disclosure also provides methods to generate magnetic field gradient waveforms that may be used in MRI, that may conform to hardware and safety constraints with respect to gradient rate-of-change, that may be minimal duration, that may be developed in an efficient and intuitive interface, that may be calculated efficiently, and that may be sequenced in a rapid, time-efficient manner that may be readily adaptable to unanticipated changes in a pulse sequence. Moreover, the sequencing methodology may be extended to any arbitrary waveform used in MRI.

Methods and systems of the disclosure may be advantageously fast to compute, and arrive very or substantially nearly to the true optimal solution that may be computed using much more time-consuming methods. Moreover, the approach may allow fast gradient pulses to be used across most, if not all, MRI applications, including the design of pulse sequence applications where the multidimensional gradient area, moment, start, and end amplitudes may be the desired input parameters.

Time-Efficient Constrained MRI Gradient Waveforms

Magnetic field gradients may be a critical component of MRI scans, as they are largely responsible for encoding spatial positions for creating images. These gradient fields in some cases may be switched on and off to encode different positional information, to prepare magnetization, and to create steady states. The speed at which these transitions can occur may directly impact the overall speed of the MRI acquisition.

At least two independent limits may be applicable in determining how quickly gradient fields can be switched. A first independent limit may be a physical hardware limit, which constrains the gradient slew rate to a specific value or range of values on each physical gradient axis. Further limits on the gradient parameters may be imposed by hardware constraints, including, but not limited to, physical heating of the gradient coils and/or amplifiers, performance characteristics of the gradient amplifiers, etc. A physical limit may exist for both gradient amplitude and also gradient slew rate. In the case of gradient slew rate, the allowable slew rate at any given instant may be a function of the gradient amplitude using for example the gradient "voltage model" known in the art. Further limits on the gradient parameters may be imposed by other hardware constraints, including, but not limited to, physical heating of the gradient coils and/or amplifiers, performance characteristics of the gradient amplifiers, etc.

A second independent limit may be a safety limit, as imposed by regulatory agencies. The safety limit may specify the maximum rate of change of magnetic field (dB/dt) that can be tolerated by a scan subject (e.g., patient), often based on a set of equations that describe the response of peripheral and cardiac nerve stimulation as a function of dB/dt and pulse duration. As a result, the safety limit may depend upon the size of the magnet or strength of the applied magnetic field, duration of the stimulus, and other factors. This is described in detail in IEC 60601-2-33, an international regulatory standard accepted by the U.S. Food and Drug Administration (FDA) and other regulatory bodies, which is entirely incorporated herein by reference. For instance, IEC 60601-2-33 in page 30 describes controlling the gradient waveforms so that the occurrence of intolerable peripheral nerve stimulation (PNS) in the patient and the MR worker is minimized, and IEC 60601-2-33 in pages 86-87 describes the calculation of an integrated maximum rate of change of a magnetic field for the waveforms on each physical axis or as a vector sum to limit PNS.

Each of the hardware limits may be expressed as a limitation on the gradient ($G_x$, $G_y$, and $G_z$) and gradient slew rate (i.e., the gradient rate-of-change—$G'_x$, $G'_y$, and $G'_z$) in each physical direction. In typically the most straightforward view of these hardware constraints, the hardware limits may be expressed as an absolute limit operating on each of three Cartesian axes independently:

$$G_x < G_{x,max,hardware}$$

$$G_y < G_{y,max,hardware}$$

$$G_z < G_{z,max,hardware}$$

$$G'_x < G'_{x,max,hardware}$$

$$G'_y < G'_{y,max,hardware}$$

$$G'_z < G'_{z,max,hardware},$$

whereas the safety limit may be defined by an inseparable elliptical constraint, based on just the slew rate in each direction:

$$(w_x G'_x)^2 + (w_y G'_y)^2 + (w_z G'_z)^2 < G'_{max,safety},$$

where $w_x$, $w_y$, and $w_z$ represent axis-specific weighting factors. Using this model and considering only two dimensions, FIG. 1 depicts a combined constraint 100 of gradient hardware and safety limits. The box 110 shown in FIG. 1 represents the hardware limit, the circle 120 represents the safety limit, and the area of overlap (hatched region 130) between the box and the circle represents a combined limit. The combined constraint shown in FIG. 1 may indicate the range of acceptable rates of change of gradients. In three dimensions, this range may represent the region of intersection between a three-dimensional ellipsoid and a three-dimensional rectangular box.

If the gradient hardware is of low-performance, then the hardware limit may not extend beyond the safety limit at any point, and a rectangular box 110 representing the hardware limitation may be the overall constraint. Conversely, for high-performance hardware, the hardware limit may exceed the safety limit in all directions and, thus, the overall constraint may be the ellipsoid or circle 120 that defines the safety limitation. Most often for a given system, though, the combined constraint falls between these two extremes. This may be due to the significant expense of gradient systems, as it may not be economically viable to engineer these systems to be capable of much more than the regulatory limit. Therefore, a complicated gradient waveform optimization may be performed in order to minimize the time required for gradients to reach their desired values, and, thus, the speed of an MRI acquisition.

The optimization becomes more complicated still when the full mathematical constraints are considered, where for the safety case, a higher slew rate may be acceptable for a shorter duration, and for the hardware case, a higher gradient rate of change may be possible if the gradient magnitude is lower than its correctly biased full-scale.

Because these constraints do not follow a simple formula but rather are typified by the piecewise, combined constraint as depicted in FIG. 1, it can be quite challenging to derive a globally optimal solution under such a constraint, particularly when a larger number of desired waveform attributes must be simultaneously met. To arrive at a tractable, unique solution, a simplification may be desired.

To optimize gradients in a time-efficient manner under these constraints using methods provided herein, the gradient properties that may be needed for a corresponding set of waveforms on each axis (e.g. x, y, and z) may be parameterized. Such properties may include the starting gradient magnitude ($s_x$, $s_y$, and $s_z$), ending gradient magnitude ($e_x$, $e_y$, and $e_z$), net gradient area ($A_x$, $A_y$, $A_z$), and various gradient moments ($M_{n,x}$, $M_{n,y}$, and $M_{n,z}$, denoting the nth gradient moment). A subset of at least two of these values may be specified on each axis to ensure a relevant solution.

For at least some imaging problems, these properties may represent the complete range of desired gradient manipulations.

Figure 2:
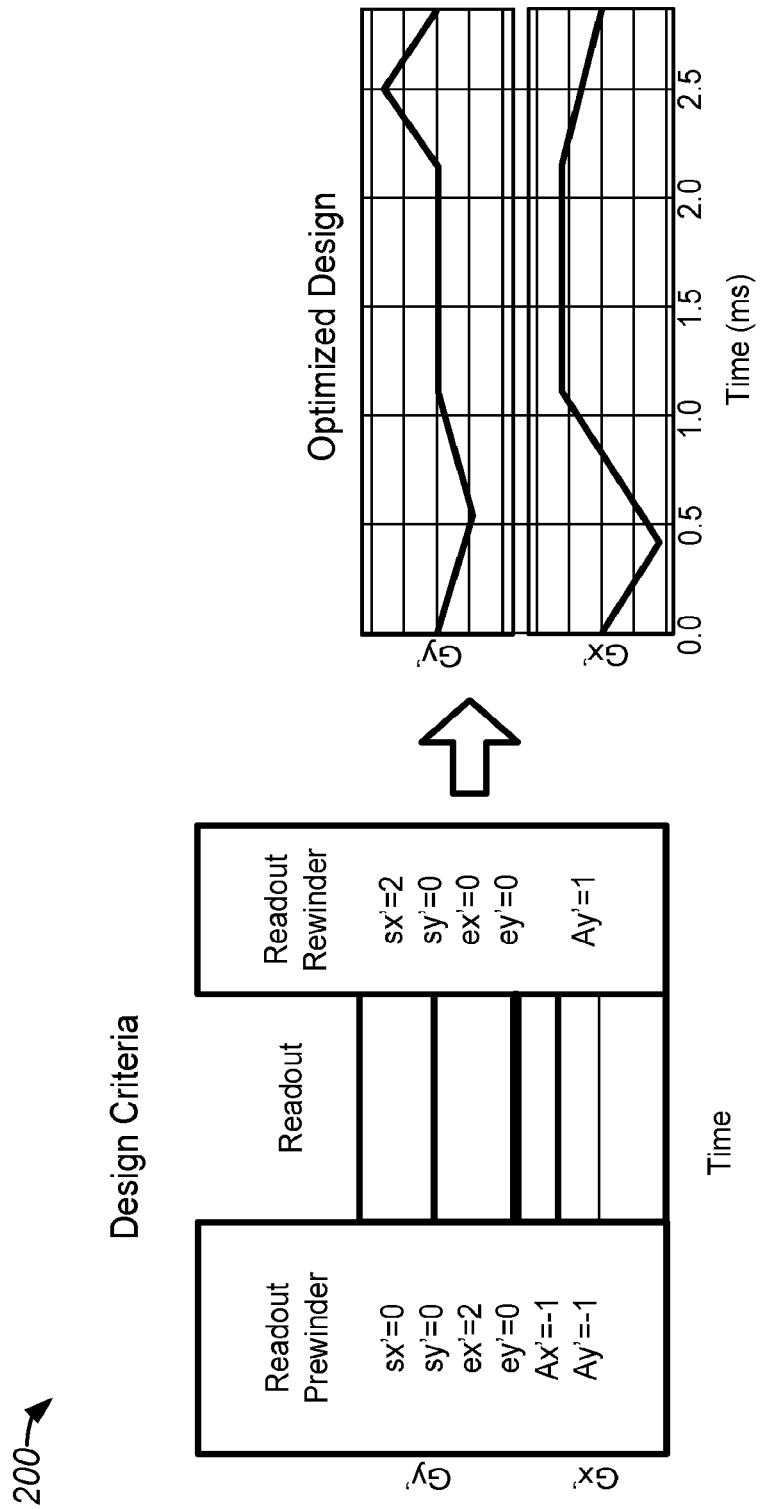
FIG. 2 shows an example of a design process wherein an efficient Cartesian readout gradient is designed with specified areas, start amplitudes, and end amplitudes.

For example, consider the typical 2-dimensional Cartesian readout design problem 200 depicted in FIG. 2. The fundamental requirement of the Cartesian readout 200 is the readout plateau, with a constant gradient amplitude on the Gx' gradient axis for a specified duration (in this example, the duration is 1 ms and the amplitude is 2 G/cm). Prior to that plateau, a so-called set of 'prewinder' gradients is necessary. The waveform shapes themselves are not important, but the waveforms must start from zero amplitude on both axes and end with Gx' at 2 G/cm and Gy' at 0. In addition, these gradients must have areas given by formulae known in the art; for the sake of example, say these are Ax'=−1 G/cm/ms and Ay'=−1 G/cm/ms. Similarly, after the readout plateau, a set of 'rewinder' gradients must be provided. In this example, they might be specified with initial amplitudes sx'=2 G/cm, sy'=ex'=ey'=0, and the Y' rewinder gradient should have a total area of 1 G/cm/ms. In this case, the total area of the X' rewinder is not of interest to us and can be left unspecified. The design challenge would be to create the fastest set of gradient waveforms that meet all of these criteria. Such a set of waveforms is depicted at the right of FIG. 2. The following discussion describes how we might accomplish this design process.

Figure 3:
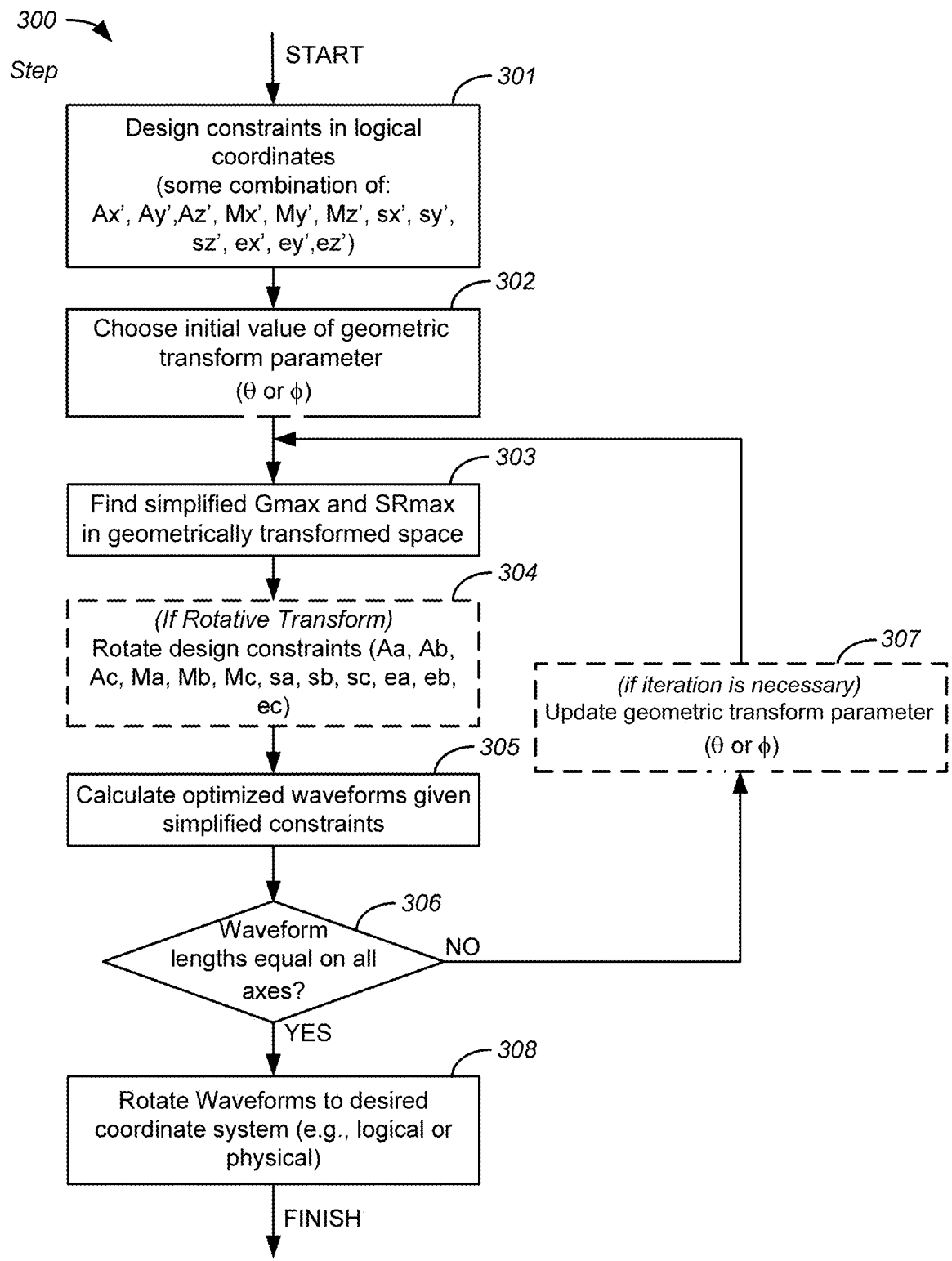
FIG. 3 is a flow chart of an exemplary process described herein for the design of time-efficient gradient waveforms.

The flow chart of FIG. 3 describes an embodiment of an iterative design process that may be used to rapidly design optimal and near-optimal gradient waveforms. The description in this paragraph is merely an overview of the entire process; additional details will be provided over the course of subsequent sections. As a first step 301, a set of multidimensional design constraints ($s_{x'}$, $s_{y'}$, $s_{z'}$, $e_{x'}$, $e_{y'}$, $e_{z'}$, $A_{x'}$, $A_{y'}$, $A_{z'}$, $M_{n,x'}$, $M_{n,y'}$, $M_{n,z'}$, or some subset thereof) is determined using techniques in the art and based upon the requirements of the imaging technique being employed. As a second step 302, a geometric transform parameter (to be used as a variable of iteration) is initialized to some value. This initial value may be chosen at random or may be selected based upon some heuristic or educated estimation based upon the design constraints. As a third step 303, that geometric transform parameter is used to arrive at a set of simplified design limits Gmax and Smax, where the simplified limits conform to a well-defined geometric relationship such as a rectangular box or spheroid. As a fourth step 304, in the case of rotative transformations defined below, the design constraints are rotated into the rotative transform space. As a fifth step 305, optimized waveforms are generated using these simplified constraints. As a sixth step 306, the resultant waveforms are tested for equal length (or any other parameter that can be left unfixed as a surrogate for length, such as relative gradient magnitude, residual area, residual moment, duration of a sub-component of the waveform, etc.). If all designed waveforms have equal length, then the iteration is considered finished; if not, then the geometric transform parameter is appropriately updated (seventh step 307) and we return to step 303. After iteration completes, the resultant waveforms may or may not be rotated in an eighth step 308 into a desired coordinate space—often, this involves transformation into physical waveforms to be used to drive the gradient hardware.

In some embodiments, parameterized gradient properties may be geometrically transformed into an alternative coordinate space, which may be denoted as a "rotative" space. This space may be denoted by axes a, b, and c. Gradient properties may be geometrically transformed with the aid of systems of the disclosure, which can include one or more computer processors. To start, the geometric transformation between logical axes (x',y',z') and (a,b,c) may be arbitrarily chosen. In matrix notation, each gradient property may be rotated using the rotation matrix that specifies the geometric transformation between the (x',y',z') and (a,b,c) coordinate systems. In this geometrically transformed coordinate system, a safe set of gradient rate-of-change limits, inscribed within the original combined constraint, may be defined that represents the maximum separable gradients possible given the combined constraint. A separable constraint is represented by a rectangle (2D) or rectangular box (3D) oriented in the (a,b,c) space. The dimensions of this box should be chosen to ensure that no portion of the box exceeds the combined original constraint, while maximizing either the area of the box, the combined axis lengths, or some other size metric on the box. Preferentially, the area of the box should be maximized such that it is inscribed within the combined constraint.

For example, if the rate-of-change limits for a given geometrically transformed space are constrained by a spherical safety limit |SRmax,safety| alone, then a separable constraint for that situation could be described by $$SR_{max,a} = SR_{max,b} = SR_{max,c} = \frac{|SR_{max,safety}|}{\sqrt{3}},$$

where the maximum slew rates on each axis here have been chosen such that they are equal to one another. An example of the application of a similar constraint for two dimensions is shown in FIG. 2.

In this example, the (a,b) coordinate system is rotated by an angle $\theta$ from the logical (x',y') system. In this particular example, the rotation matrix is $$\begin{bmatrix} \cos\theta & -\sin\theta \\ \sin\theta & \cos\theta \end{bmatrix}$$

and points (x',y') in the logical space can be geometrically transformed into the (a,b) space using the matrix equation:

$$\begin{bmatrix} a \\ b \end{bmatrix} = \begin{bmatrix} \cos\theta & -\sin\theta \\ \sin\theta & \cos\theta \end{bmatrix} \begin{bmatrix} x' \\ y' \end{bmatrix}.$$

In this example, the separable constraint is dictated by the global safety constraint given by $$SR_{max,a}^2 + SR_{max,b}^2 \leq SR_{max,safety}^2,$$

the separable-constraint area is maximized by an inscribed square with side length given by $$SR_{max,a} = SR_{max,b} = \frac{|SR_{max,safety}|}{\sqrt{2}}.$$

Note that the square root here differs from the above equation because it is a two-dimensional example.

In the coordinate space of the rotated box, side lengths are constrained so that each corner vertex intersects with the global safety constraint. In one example of geometrically transformed spaces 400 shown in (a) of FIG. 4, the allowed gradient rates of change in the geometrically transformed space correspond to the dark shaded region of the rotated box circumscribed by the safety limit circle. For the sake of simplicity, the coordinate space in (a) has been set so that logical and physical coordinate systems are the same (x,y,z)=(x',y',z'). The more general case, where logical and physical coordinates are not coincident, is shown in (d) of FIG. 4.

In other embodiments, a geometrically transformed space may be chosen through proportionate selection of limits along the cardinal logical axes rather than by an additional rotation. This case, depicted in (b) of FIG. 4 for the simplified case where logical and physical coordinates are equivalent, permits the selection of unique limit maxima along each logical axis. In the case of gradient magnitude limits, these could be denoted with (Gmax,x', Gmax,y', Gmax,z') and in the case of slew-rate limits, (SRmax,x', SRmax,y', SRmax,z'). To facilitate creation of this type of geometric transform and later iteration, an angle $\phi$ may be selected as shown in (b), and the corner of the box chosen to conform to the minimum limit at that angle from the origin. For the example shown, with safety limits being the operable limit in that case, the limits would be:

$$SR_{max,x'} = 2|SR_{max,safety} \sin(\phi)|$$

$$SR_{max,y'} = 2|SR_{max,safety} \cos(\phi)|.$$

Figure 4:
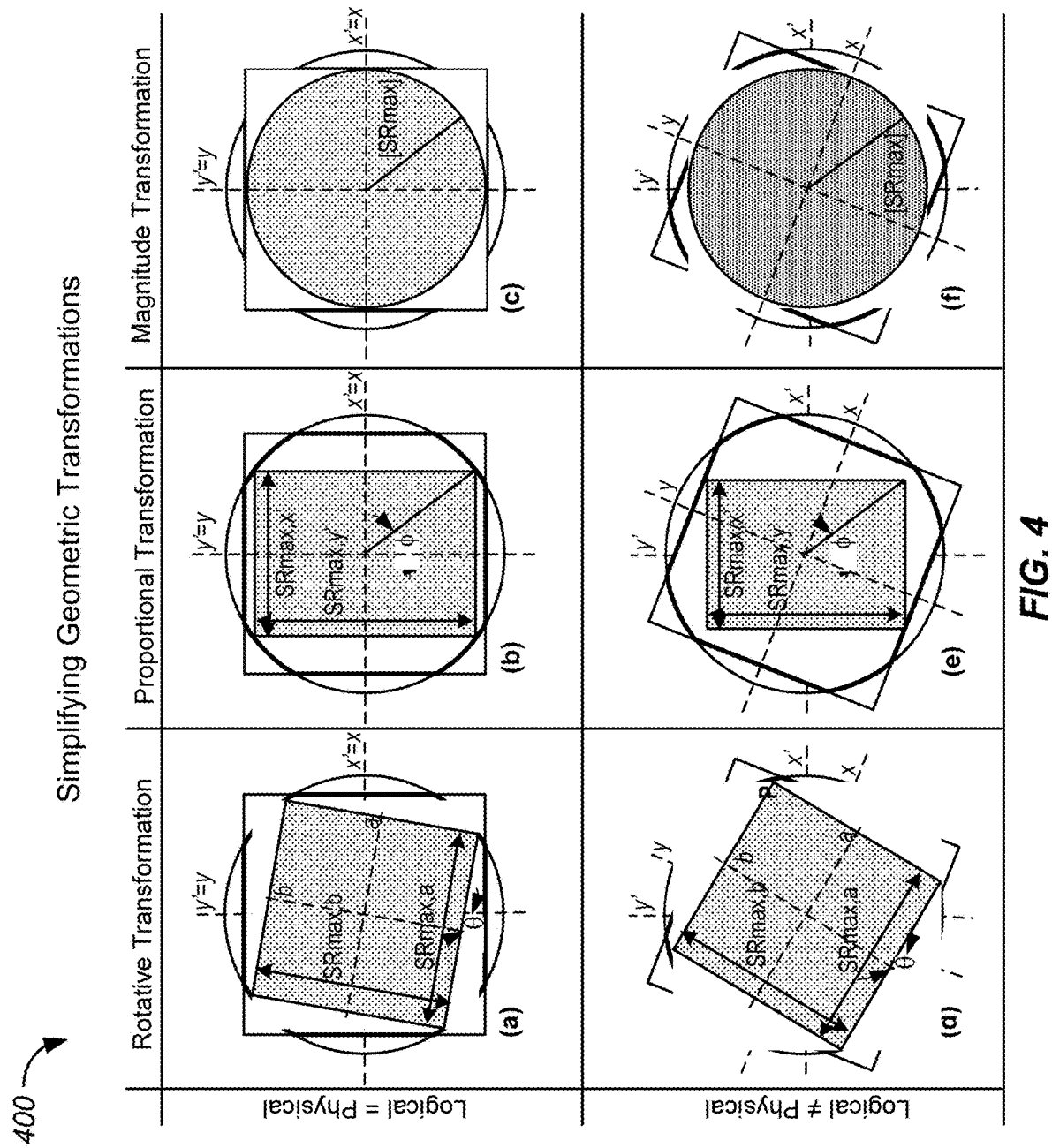
FIG. 4 describes an exemplary set of simplifying geometric transformation and rotation elements of the present invention used to calculate time-optimal magnetic field gradient waveforms in a two-dimensional example. In (a) (b) and (c), physical gradient axes (Gx, Gy) and logical gradient axes (Gx', Gy') overlap. In (d) (e) and (f), these coordinate systems differ. In (a) and (d), an additional rotation is introduced to create a geometrically transformed space in which to apply separable gradient design techniques. Alternatively, (b) and (e) show a proportional approach that can be applied to provide an alternative separable geometric transform space. Finally, (c) and (f) show a magnitude-based simplifying geometric transform that is not separable but nonetheless can simplify some designs. In each case, the shaded region indicates a combined, simplified safety/hardware constraint in the geometrically transformed space.

A more generalized case for this type of geometric transformation, where logical and physical coordinate axes are not equivalent, is shown in (e) of FIG. 4. Note that in this geometric transformation, the axes of the box do not rotate along with the physical axes and therefore a different set of limits may be operative. In the case depicted, the new logical frame leads to new limits that are dictated by the hardware slew limits rather than the safety limits.

In still other embodiments, a simplifying geometric transform may be applied that limits created gradients based upon a magnitude or spheroidal constraint. This case is depicted for two dimensions in (c) of FIG. 4 for coincident logical and physical axes, and in (f) of FIG. 4 for unequal logical and physical axes. For a spheroidal constraint, axes of the spheroid may be chosen along physical axes x,y,z in which case the slew rate constraint would be:

$$\frac{SR_x^2}{\min\left(SR_{x,max,hardware}, \frac{SR_{max,safety}}{w_x}\right)^2} + \frac{SR_y^2}{\min\left(SR_{y,max,hardware}, \frac{SR_{max,safety}}{w_y}\right)^2} + \frac{SR_z^2}{\min\left(SR_{z,max,hardware}, \frac{SR_{max,safety}}{w_z}\right)^2} \leq 1$$

This choice of constraint may not allow separable design as the gradient limits in one axis are affected by gradients on the other axes. However, well defined solutions for common problems exist for spheroidal constraints, so in many cases a closed-form solution exists. As an example, take the simplified 2D case depicted in (c) or (f). Because the hardware constraint is smaller than the safety constraint on both physical axes, $|SR_{max}|=SR_{max,hardware}$. Using this magnitude transformation, a set of optimized waveforms for the readout rewinder of FIG. 2 can be derived. On the x' axis, the length of the final waveform is given by $$\frac{s_{x'}}{SR_{x'}} = L,$$

where L is the length of the waveform and $SR_{x'}^2 + SR_{y'}^2 \leq SR_{max,hardware}^2$ as a result of applying the above slew rate constraint equation, and noting that the slew rate constraints can be applied in the logical frame because of the circular constraint boundary. On the y' axis, a similar equation for L can be derived assuming a triangular waveform:

$$2\sqrt{\frac{A_{y'}}{SR_{y'}}} = T.$$

It is often desired these times T to be equal on all axes, so setting these equations equal to one another and solving for SRy' results in:

$$SR_{y'} = \frac{-s_{x'}^2}{8A_{y'}} + \sqrt{\frac{s_{x'}^4}{64A_{y'}^2} + SR_{max,hardware}^2}.$$

Assuming a SRmax,hardware of 9.5 G/cm/ms and other parameters from FIG. 2, this equation can be solved to find SRy'=8.99 G/cm/ms and SRx'=3.08 G/cm/ms. These slew rates lead to waveforms with total duration T=0.65 ms. Note that in this solution, iteration was not required to arrive at a solution with equal durations on all axes.

The choice between these three geometric transform spaces may be arbitrarily made, and indeed the optimized gradients that result are often similar in performance. The proportional transformation (in (b) and (e)) can be advantageous because it allows for post-hoc scaling of logical gradient waveforms. More specifically, often a gradient scaling operation occurs from repetition to repetition along a specific axis, as may typically occur in Cartesian phase-encoding gradients known in the art. These phase-encoding gradients would typically be implemented by scaling (reducing) gradients along the logical Gy' axis while leaving the Gx' magnitude unaltered. Looking at point P in (d), one can see that such a Gy' reduction without changing Gx' could easily lead to a parameter value outside of the allowable combined constraint. Conversely, when using the proportional or magnitude transformation approaches, any scaling along x' and y' axes can be accommodated and is certain to be within the combined constraint. Thus, this method is more generally useful in cases where gradient scaling is desired after the gradient-design stage. Furthermore, the proportional and magnitude methods are more amenable to composing gradients where different types of limits are desired on different axes, like having a gradient area constraint on one axis but only gradient start and end constraints on other logical axes. The operation of geometrically transforming the constraints cannot be efficiently performed in the rotative-transform space.

Regardless of the transform space chosen (rotative, proportional, or magnitude), time-optimal gradient waveforms may be calculated by iterating over the full range of its transform parameter ($\theta$ for rotative transforms, or $\phi$ for proportional ones; iteration may or may not be necessary for magnitude transforms). A flowchart of the process 300 is given in FIG. 3.

The combined constraint with respect to the geometrically transformed space may be solved symbolically for each case where some subset of areas, gradients, start, and end magnitudes are desired.

As an example, consider again the Cartesian Readout of FIG. 2. To design the rewinder block, a simple ramp is required on the X' axis, and a trapezoid or triangle is required on Y'. The duration of the X' ramp can be calculated for a known slew rate SRx' using $$T_{x'} = \frac{s_{x'} - e_{x'}}{SR_{x'}}.$$

Using the values in the example and given a slew rate SRx'=3 G/cm/ms, the duration Tx' for this ramp iteration would be ⅔ ms. Note that this result is extremely similar to the result determined using the magnitude transformation above.

On the Y' axis, a specified area Ay' is needed, so a simple ramp is not sufficient. Assuming a triangle waveshape would suffice, the area of which can be derived as $$A_{y'} = \left(\frac{s_{y'}}{2} + \left(s_{y'} + SR_{y'}\frac{T_{y'}}{2}\right) + \frac{e_{y'}}{2}\right)\frac{T_{y'}}{2}.$$

Rearranging terms and using the quadratic formula to solve for Ty', we arrive at $$T_{y'} = \frac{3s_{y'} + e_{y'}}{2SR_{y'}} \pm \frac{\sqrt{\left(\frac{3s_{y'} + e_{y'}}{2}\right)^2 + 4A_{y'}SR_{y'}}}{SR_{y'}}.$$

For the values in the example and given a slew rate SRy'=9 G/cm/ms, the duration Ty' for this iteration would be ⅔ ms. As this is identical to the duration found for Tx', an optimal solution has been found and the iteration would be ceased at this point.

The result of this calculation may be a set of gradient waveforms for each geometrically transformed axis. If desired, these waveforms can be geometrically transformed back into logical or physical coordinate spaces using a rotation matrix approach similar to that described above.

In some embodiments, if the durations of the set of gradient waveforms on each transformed axis are equal to each other, then it may be determined that a minimum time solution has been found. However, if the gradient waveforms have different durations on any axis, then an improved solution may exist at a different rotation angle. To find this angle, a new selection of transform parameter can be selected, and the same procedure may be repeated until an acceptable solution is found. Once a minimum time solution has been found, the calculated waveforms in the geometrically transformed space may then be geometrically transformed back to the physical space to drive the MRI system's gradient hardware.

The required degree of rotation for the geometrically transformed space that may be searched for an optimal solution may be limited to only one quadrant of the circle (in the two-dimensional example, 0-90 degrees) shown in FIG. 4, or one eighth of the space of solid angles in the 3-dimensional case In some cases, the target function of differences between gradient durations may be well-behaved and smooth, meaning that a rapid nonlinear iterative solution solver can be applied. A binary search implementation can be made to find the best solution within at least about 1, 2, 3, 4, 5, 6, 7, 8, 9, 10, 20, 30, 40, 50, or 100 iterations. In some examples, a best solution may be found within at most about 1, 2, 3, 4, 5, 6, 7, 8, 9, 10, 15, 20, 30, 40, 50, 100, 200, 300, 400, 500, or 1000 iterations. In some cases, a nonlinear iterative search algorithm, such as conjugate gradient descent, Krylov subspace methods, and others can be used. Commonly used implementations can be found in MATLAB, C, C++, and other programming languages. A nonlinear iterative search algorithm may be suited for three-dimensional solutions, where the additional degree of freedom in the solution may render a binary search inefficient.

Figure 5:
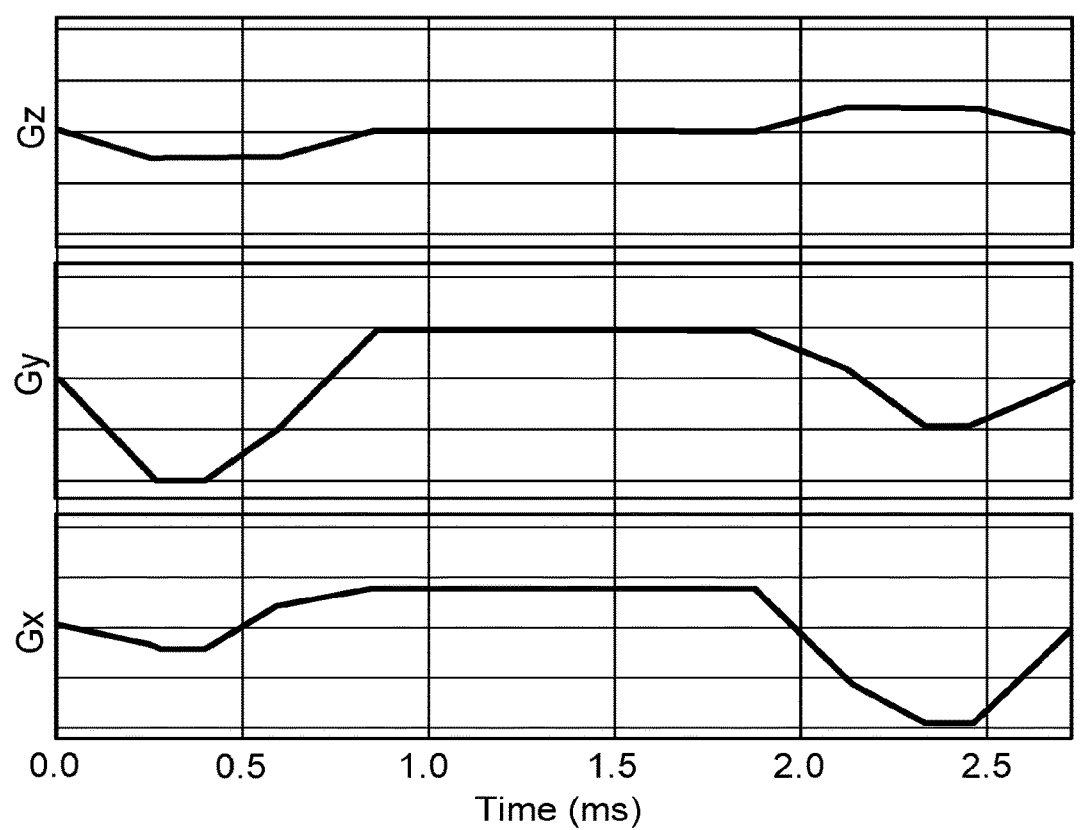
FIG. 5 describes physical magnetic field gradient waveforms calculated as a function of time using the present invention in a three-dimensional example.

FIG. 5 shows the physical gradients designed by methods of the disclosure as a function of time, for a case in three-dimensions. FIG. 6 shows the point-wise gradient change limits for the waveform of FIG. 5. Solid straight lines at x=+−15 G/cm/msec and y=+−15 G/cm/msec represent hardware limitations specified for this example. Curved solid lines represent maximum safe rates of change due to regulatory limitations. Many of the data points reside near one boundary or the other, most data points are at the theoretical limit, and the average data point is at about 93% of that limit. A truly optimal waveform would be at 100%. The methods described herein can thereforecome very close to the theoretical ideal while taking very little time to calculate.

Methods and systems of the disclosure may be used for nonlinear magnetic field gradients, in which the constraint space may be more difficult to describe than the geometric shapes shown here.

Additional special constraints may be used depending on how the resulting gradient is expected to be used. For example, if the gradient must be freely rotatable so that it can be used in any scan-plane orientation, then constraints may be limited to a spherical space inscribed into the existing combined constraint. As previously discussed, it may be desirable for one or more of the gradient axes to be scaled down independently, in which case that scaling may result in exceeding limits on another axis. Use of either the proportional or magnitude/spheroidal optimization methods can avoid this difficulty. This may be of concern when designing gradients to be used in phase-encoding, unless separate optimizations are to be used for each phase-encoding step.

This technique may converge quickly. In some examples, this technique may converge is a time period of at least about 1, 2, 3, 4, 6, 7, 8, 9, 10, 15, 20, 30, 40, 50, or 60 seconds or 1, 2, 3, 4, 5, 6, 7, 8, 9, 10, 15, 20, 30, 40, 50, or 60 minutes or 1, 2, 3, 4, 5, 6, 7, 8, 9, 10, 12, 18, or 24 hours. This technique may also not be computationally intensive and may also be sped up by further parallelization of the computation steps. In particular, multiple values of the transform parameter could be independently analyzed, effectively parallelizing steps 3 through 6 in FIG. 3. Parallelization may be particularly useful in a three-dimensional computation. A good initial estimation (or seed) for the geometric transformation between the physical space and the geometrically transformed space may also greatly speed up the computation. This may be accomplished through heuristic algorithms based upon the gradient parameters to be optimized.

For example, if areas Ax', Ay', and Az' are desired, an initial guess for slew rate limits and gradient limits along these axes might be a set of parameters that are scaled proportionally to the relative sizes of the desired areas:

$$SR_i \propto \frac{A_i}{\sqrt{A_{x'} + A_{y'} + A_{z'}}},$$

where i represents each of x', y', and z'.

The technique described above may be further optimized by combining iterations for different types of geometric transformations (e.g., rotative and proportional). In other words, both rotative and proportional solutions might be obtained, and the fastest of the two chosen for use. In this case, the additional optimizations may take very little time if the solution from the other transformation type is used as a starting point for the next type of iteration. Otherwise, the iteration may proceed as in the original case.

The ability to produce multidimensional optimized gradients with given start and end amplitudes, areas, and moments may also be incorporated into a graphical tool for MRI pulse-sequence designers (or systems) to rapidly and flexibly produce pulse sequences. Such a tool may be presented as a graphical user interface of the system. Such a tool may provide the ability to arbitrarily place pulse blocks with given amplitudes, areas, and moments, and to specify their temporal relationships to one another. In such a case, the ability to rapidly compute new optimized gradients may be essential to providing immediate feedback to the user in response to parameter changes.

In addition to peak slew rate limitations, alternative or additional gradient safety limits may be applied. For example, in the so-called "fixed-parameter" mode of MRI scanning for use on patients with indwelling metallic implants, additional constraints on peak gradient slew rate and root-mean-square (RMS) gradient slew rate may be applied. These additional constraints may be incorporated into the separable design process and similarly used to arrive at an efficient set of waveforms given the combination of all applied constraints. Similarly, these additional constraints could be applied on patients undergoing interventional procedures using metallic catheters, guidewires, and other interventional devices.

While the techniques of the disclosure may have greatest application in the design of waveforms by specified area, moments, and start and end amplitudes, there may also be the possibility of creating specific k-space trajectories via the same techniques. k-Space is the term for the format in which MRI raw data is initially collected. This raw data must undergo a Fourier transform in order to convert it to image data. Locations traversed in k-space are proportional to the net integrated area under the gradient waveforms; thus, specifying gradients by their net area can directly lead to traversal of a desired k-space trajectory. Sampling may be performed along simple trajectories that allow for a trivial solution and shorter scan times. For example, such k-space sampling may be along parallel lines.

More complicated sampling trajectories may be advantageous, but often may also require nontrivial solutions and, thus, longer scan times. For example, a spiral k-space trajectory, first proposed by both Likes (U.S. Pat. No. 4,307,343) and Ljunggren (JOURNAL OF MAGNETIC RESONANCE S4, 338-343 (1983)), can imply a specific area requirement for arriving at each k-space location. Spiral scans may be an efficient way to cover k-space and may be particularly advantageous in the presence of a dynamic environment such as in the heart or flowing blood.

There are a number of gradient waveforms that may trace out a particular spiral k-space trajectory. The design of these gradient waveforms may be an important element of spiral scanning, and a number of iterative and non-iterative approaches (e.g., U.S. Pat. No. 6,020,739) have been successfully applied to this problem. Again, however, these approaches may be time consuming to implement and not readily amenable to real-time imaging.

To arrive at a spiral trajectory in a time-efficient manner using the disclosed methods, the k-space sampling step may be set as finely as desired for accurate trajectory fidelity. Then, starting from the first k-space sample (e.g., at the k-space origin), separate optimization procedures may be used to step from the previous k-space location to the next locations. At each step, the start amplitude may be specified as the ending amplitude of the previous step, and the end amplitude may be left unconstrained. In the final step, a rewinder (the trajectory segment that connects the end of the spiral with the origin) may be designed with zero end amplitude and sufficient area to refocus to the k-space origin.

Waveform Switching

MRI may require the rapid uploading of sets of arbitrary waveforms, that include waveforms for gradients, radiofrequency (RF) channels, shims, and/or fields into a piece of dedicated MR sequencing hardware that may be limited in processing power and/or available memory. Parameters of these waveforms such as their durations, amplitudes, data points, and number all may change arbitrarily and may not be known ahead of time.

While memory and computation power may be getting cheaper, sequencer hardware systems tend to be memory and processor-limited. For example, it may be impractical to provide enough on-board memory on these processors to contain all the samples needed to sequence an entire 2-hour scan with 5 16-bit data channels at 500 kHz (~32 GB of memory). Even if the memory itself were not a limitation, the time required to transfer these amounts of data may prohibit real-time sequencing changes.

MR imaging sequences, though, may consist of a high degree of repetition. Therefore, vastly smaller chunks of waveform and associated parameter data may be uploaded to the sequencing hardware along with a schedule of instructions for the order and amount of repetition required for proper playback. This type of simple compression may reduce memory requirements, even for very long scans. Because of processing limitations, the method for compression may be through per-axis waveform schedulers, shown in conceptual form in FIG. 7.

Figure 7:
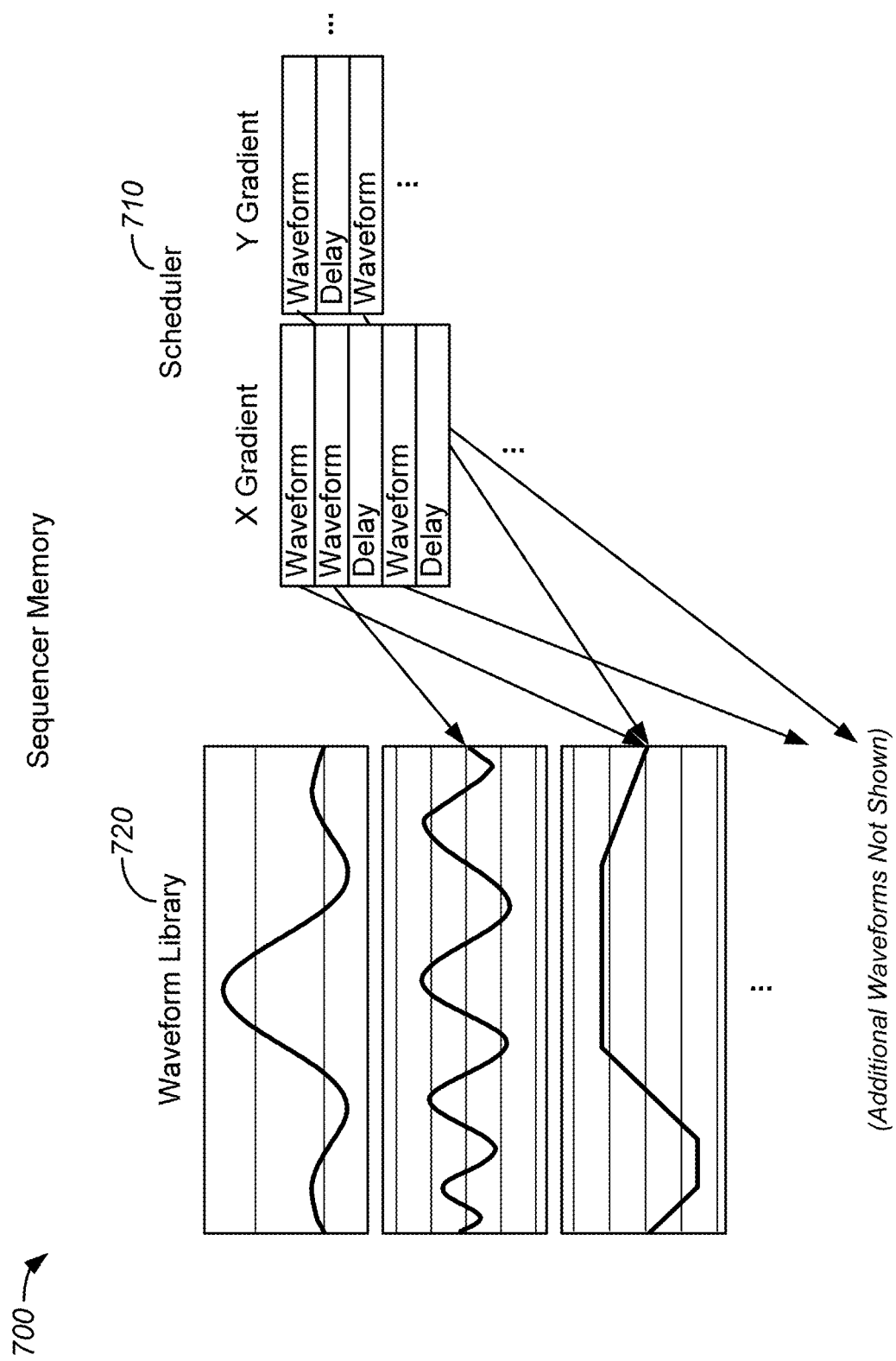
FIG. 7 is a conceptual schematic describing the computer memory architecture that may be used in MRI sequencing hardware. A scheduler for each waveform axis plays waveforms uploaded into a waveform library. The scheduler may make simple transformations such as bulk amplitude changes, duration changes, phase/rotation changes, or changes to which waveform in the library the scheduler may be pointing.

As shown in FIG. 7, uploaded schedulers 710 may be "played" for each waveform axis as a sequence is executed. The schedulers may provide a list of pointers to waveforms in the uploaded waveform library 710, so that waveform sections that may need to be repeated are only stored once. The scheduler may also: execute simple 'geometric transformations' on any waveform in the library, including bulk amplitude changes, duration changes, phase/rotation changes; change the waveform pointer to point at a different location in the waveform library; or schedule delay elements.

Figure 8:
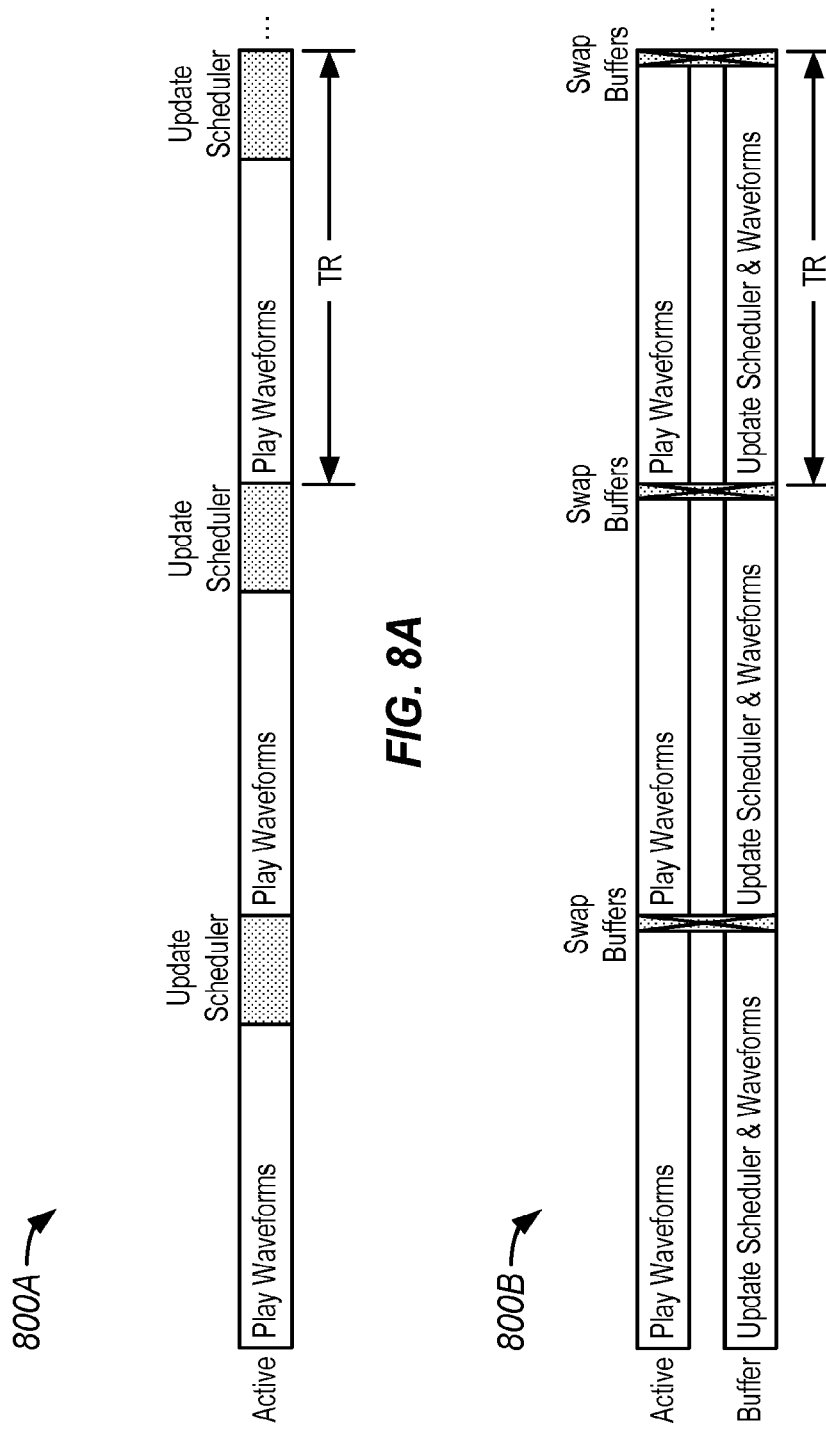
FIG. 8a schematically shows a waveform sequence execution from hardware computer memory. Waveforms may be played from computer memory using the scheduler. Following playback, the scheduler may be serially updated in the computer memory during a period of waveform inactivity. The switching of waveform sequence playback and scheduler update may repeat until an imaging sequence is completed.
FIG. 8b schematically depicts a waveform sequence of the invention. Waveforms may be played in an active memory region while the required updates to both the waveform library and scheduler for a future sequencing interval (TR) may be concurrently uploaded into a separate buffer region. The active region may be swapped with the buffer region corresponding to the next TR and that buffer region then may be played as the new active region, whereas the former active region may now function as a buffer region for a subsequent playback period.

Serial sequencing 800A is shown in FIG. 8a. Each axis' scheduler may execute until it reaches the end of its sequence of instructions for playback. Additional time may then be reserved for updating the scheduler with any changes to the set of waveforms parameters. The complete cycle (playback+scheduler updating), occurs over a time interval TR and repeats itself with the updated scheduler being played at the start of the next cycle. This allows for basic MRI sequencing and may provide all the functions needed for scanning when all of the possible scan parameters are known in advance. Serial sequencing, as described herein, may be combined with or modified by U.S. Pat. Nos. 7,053,614, 7,102,349, and 5,465,361, which are entirely incorporated herein by reference.

The method of FIG. 8a may not be capable of addressing changing waveforms and sequence timings based upon arbitrary external events, such as changes entered via user input. In this case, it may be that no amount of change to the scheduler can provide the unanticipated new waveform that is needed—additional waveform uploading, and, thus, additional sequencing time may be required. Furthermore, the serial nature of the scheduler update after each playback period (FIG. 8a) indicates that scan efficiency may be compromised, as all sequencers may be inactive during scheduler updating. In order to keep TR to a minimum, the serial nature of sequencing may also limit the amount of scheduler changes that can practically be accomplished during each TR interval. To permit faster changes to arbitrary waveforms during active scanning, another method is needed.

This disclosure provides systems and methods 800B for buffering changes to the scheduler and waveform libraries while keeping the existing hardware structure and memory layout, as shown schematically in FIG. 8b. Additional memory may be allocated within the sequencer to permit buffering of all scheduler updates and associated waveforms. While one TR of waveforms is being played from an active memory region, the scheduler and waveform library for a future TR may be updated into the buffer memory.

At the end of one TR, the active memory region under playback may be swapped with the buffer memory region containing the next updates to be played. Depending on hardware limitations, this swap may require a short period of sequencer inactivity, or it may be possible to perform this swap atomically, in which case no period of sequencer inactivity is required. In the case of atomic swapping, then full-duty-cycle waveform playback may be achieved while allowing for arbitrary changes in sequences to be driven by the external host computer.

Figure 9:
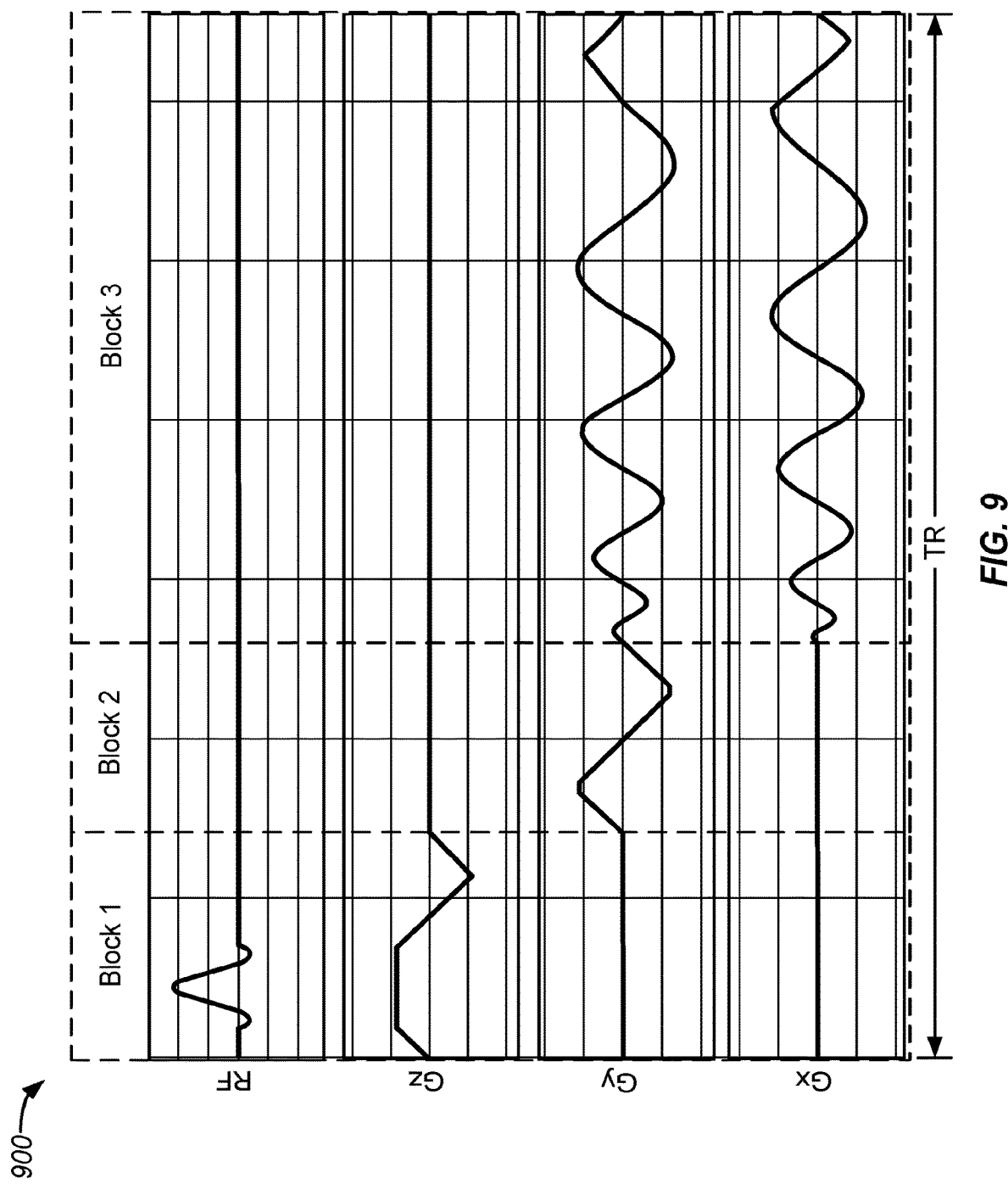
FIG. 9 shows a single TR of a spiral flow-encoded pulse sequence showing an example of how a TR interval may be divided into three distinct blocks.

Each TR interval may be broken into one or more sub-intervals, called blocks to facilitate fast changes to waveforms. For example, FIG. 9 shows one TR 900 of a spiral flow-encoded pulse sequence wherein three logical functions are sequentially completed: slice selection, flow encoding, and spiral readout. These blocks may or may not be divided into separate sub-blocks (labeled Block 1, Block 2, and Block 3 here). Blocks may contain logical elements of the pulse sequence that include, but are not limited to, an inversion pulse or flow-encoding gradients. Moreover, several logical functions may be combined into one block. Real-time changes such as rotations, scaling, and enabling/disabling may be performed at the block level, allowing the pulse sequence designer the ability to precisely define the scope of any anticipated change.

While the present technique may allow for uploading and playback of arbitrary waveforms at any time, it may also be combined with one or more conventional methods (e.g., providing special functions for waveform scaling, rotations, phase modifications, etc.) to allow a more limited set of modifications at the sequencer level. This may permit backward compatibility with existing applications that may require such operations to be present on the sequencer. Moreover, it may also be more efficient to perform such waveform transformations without re-uploading the waveforms to the sequencer.

If the computer servicing the buffer memory is unable to achieve real-time response, then a longer buffer of queued TRs may be desired. The technique may be adapted to create a longer waveform and scheduler queue that permits the waveform-generating computer to have periodic intervals of slower responsiveness. If this buffer were implemented as a standard first-in-first-out (FIFO) queue, then any asynchronous changes to the sequence may be delayed by a time corresponding to the buffer's length. To prevent this latency, the buffer may be safely flushed whenever an unanticipated change occurs. Flushing the queue from the end and going backward may allow the fastest possible change while allowing for potential computer slowdowns.

As an example, during a spiral-scanning MRI experiment, the user may desire to acquire a higher resolution or a different field-of-view. Such alterations to the pulse sequence may necessitate a change to the spiral readout trajectory that may not have been anticipated prior to scanning Other systems presently available may not permit changes to the waveform library after the start of a scan, and, thus, may not allow the required change to the spiral readout trajectory. These changes may be permitted, however, with architecture of the present invention as a buffer memory region exists for storing the waveforms needed to change the spiral readout trajectory prior to playback. In addition, such new waveforms may also have different lengths and other associated parameters, which may require updates to the scheduler which can also be generated in the buffer memory region prior to playback.

In another example, the present invention may allow an imaging sequence to autonomously adapt to conditions based upon image features of prior acquired real-time data. If prior real-time images indicate that the field-of-view is too small for the area being displayed, alternative spiral waveforms may be generated and substituted into the imaging sequence in real-time.

In yet another example, spiral trajectory corrections based upon eddy-current estimates may be pushed to the sequencer in real-time during scanning, rather than stopping the imaging sequence, making the corrections, and restarting.

The present invention may allow more time to be dedicated to scheduler and waveform updates, without increasing the total scan time and also may permit any sequence to be played as long as the respective update required for desired playback can be computed faster than TR. In addition, an interrupt or other standard concurrency technique (e.g., mutex, semaphore, etc.) may be used to adaptively set the sequence repetition time to accommodate whatever time is required to sequence the next interval by extending the current TR or by interjecting a transitional TR interval.

Moreover, the methods and systems disclosed herein may also allow all aspects of the sequence to be changed, including, but not limited to, the waveforms in the uploaded library, sequence timings, and number of waveform pulses.

Moreover, methods of the disclosure may be applied on any scanner (e.g., MRI scanner) that uses two-level scheduler and waveform libraries. At the present time, most scanners use such architecture as a part of their sequencing hardware.

Systems

This disclosure provides computer system that may be programmed or otherwise configured to implement methods provided herein.

Figure 10:
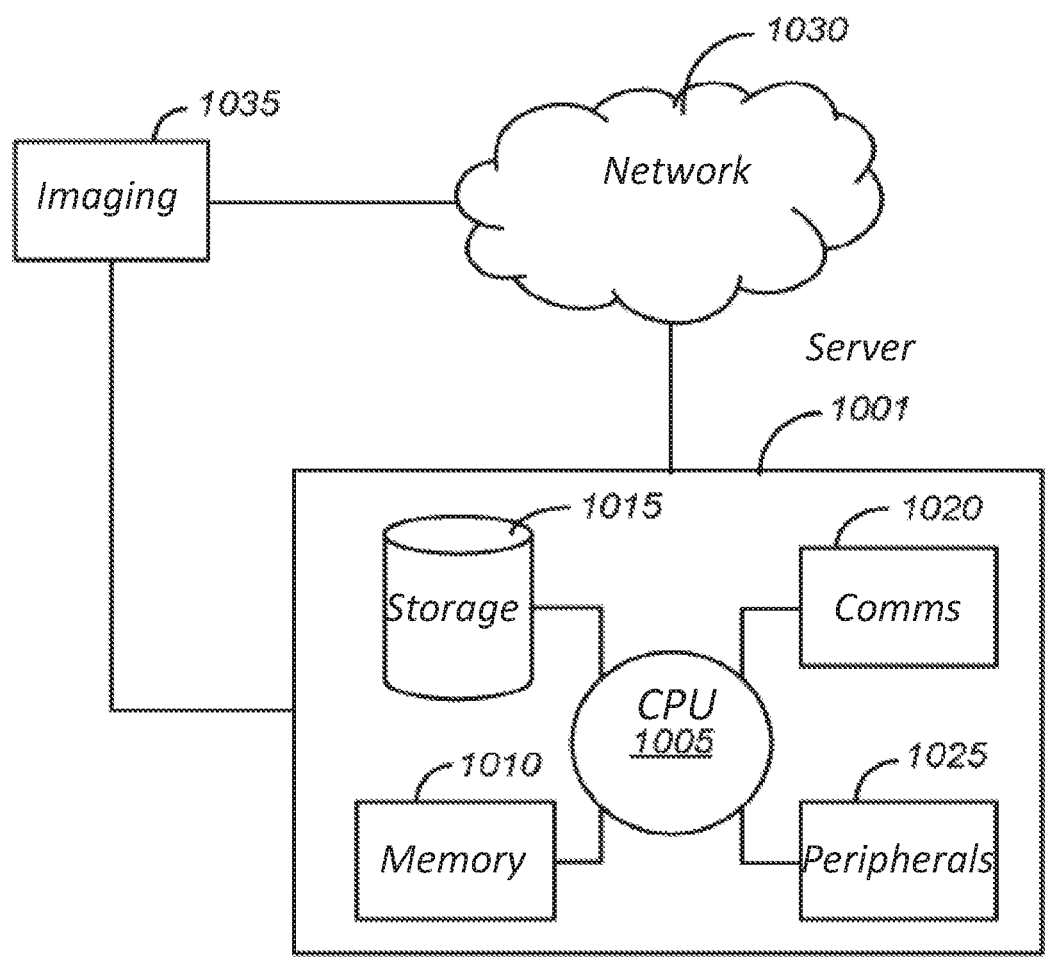
FIG. 10 schematically illustrates a computer system that may be programmed to implement methods of the disclosure.

FIG. 10 schematically illustrates a system 1000 comprising a computer server ("server") 1001 that is programmed to implement methods described herein. The server 1001 may be referred to as a "computer system." The server 1001 includes a central processing unit (CPU, also "processor" and "computer processor" herein) 1005, which can be a single core or multi core processor, or a plurality of processors for parallel processing. The server 1001 also includes memory 1010 (e.g., random-access memory, read-only memory, flash memory), electronic storage unit 1015 (e.g., hard disk), communications interface 1020 (e.g., network adapter) for communicating with one or more other systems, and peripheral devices 1025, such as cache, other memory, data storage and/or electronic display adapters. The memory 1010, storage unit 1015, interface 1020 and peripheral devices 1025 are in communication with the CPU 1005 through a communications bus (solid lines), such as a motherboard. The storage unit 1015 can be a data storage unit (or data repository) for storing data. The server 1001 is operatively coupled to a computer network ("network") 1030 with the aid of the communications interface 1020. The network 1030 can be the Internet, an internet and/or extranet, or an intranet and/or extranet that is in communication with the Internet. The network 1030 in some cases is a telecommunication and/or data network. The network 1030 can include one or more computer servers, which can enable distributed computing, such as cloud computing. The network 1030 in some cases, with the aid of the server 1001, can implement a peer-to-peer network, which may enable devices coupled to the server 1001 to behave as a client or a server. The server 1001 is in communication with a imaging device 1035, such as a magnetic resonance imaging (MRI) device or system. The server 1001 can be in communication with the imaging device 1035 through the network 1030 or, as an alternative, by direct communication with the imaging device 1035.

The storage unit 1015 can store files, such as computer readable files (e.g., MRI files). The server 1001 in some cases can include one or more additional data storage units that are external to the server 1001, such as located on a remote server that is in communication with the server 1001 through an intranet or the Internet.

In some situations the system 1000 includes a single server 1001. In other situations, the system 1000 includes multiple servers in communication with one another through an intranet and/or the Internet.

Methods as described herein can be implemented by way of machine (or computer processor) executable code (or software) stored on an electronic storage location of the server 1001, such as, for example, on the memory 1010 or electronic storage unit 1015. During use, the code can be executed by the processor 1005. In some cases, the code can be retrieved from the storage unit 1015 and stored on the memory 1010 for ready access by the processor 1005. In some situations, the electronic storage unit 1015 can be precluded, and machine-executable instructions are stored on memory 1010. Alternatively, the code can be executed on a remote computer system.

The code can be pre-compiled and configured for use with a machine have a processer adapted to execute the code, or can be compiled during runtime. The code can be supplied in a programming language that can be selected to enable the code to execute in a pre-compiled or as-compiled fashion.

Aspects of the systems and methods provided herein, such as the server 1001, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The server 1001 can be configured for data mining, extract, transform and load (ETL), or spidering (including Web Spidering where the system retrieves data from remote systems over a network and access an Application Programmer Interface or parses the resulting markup) operations, which may permit the system to load information from a raw data source (or mined data) into a data warehouse. The data warehouse may be configured for use with a business intelligence system (e.g., Microstrategy®, Business Objects®).

The results of methods of the disclosure can be displayed to a user on a user interface (UI), such as a graphical user interface (GUI), of an electronic device of a user, such as, for example, a healthcare provider. The UI, such as GUI, can be provided on a display of an electronic device of the user. The display can be a capacitive or resistive touch display. Such displays can be used with other systems and methods of the disclosure.

Methods and systems of the disclosure may be combined with or modified by other methods and systems, such as those described in U.S. Pat. Nos. 5,512,825, 6,020,739, 6,198,282, 7,301,341, 5,465,361, 7,102,349, and 7,053,614, which are entirely incorporated herein by reference.

It should be understood from the foregoing that, while particular implementations have been illustrated and described, various modifications can be made thereto and are contemplated herein. It is also not intended that the invention be limited by the specific examples provided within the specification. While the invention has been described with reference to the aforementioned specification, the descriptions and illustrations of the preferable embodiments herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents. It is intended that the following claims define the scope of the invention and that methods and structures within the scope of these claims and their equivalents be covered thereby.

What is claimed is:

1. A method of generating a multi-dimensional gradient waveform for use in a magnetic resonance imaging (MRI) device coupled to a computer system, the method comprising:
   (a) providing a set of design constraints for the multi-dimensional gradient waveform along each dimension of the multi-dimensional gradient waveform, wherein the set of design constraints comprise a gradient start amplitude and a gradient end amplitude;
   (b) providing a set of hardware limitations for maximum gradients achievable by the MRI device, the set of hardware limitations comprising a maximum gradient slew-rate on each physical axis of the MRI device and a maximum gradient amplitude on each physical axis;
   (c) providing, a set of regulatory limitations for maximum gradient fields that may be safely applied to a scan subject, the set of regulatory limitations comprising a maximum safe rate of change of a magnetic field of the MRI device for the scan subject;
   (d) applying, with the aid of the computer processor, one or more geometric transformations to the set of design constraints, the set of hardware limitations, and the set of regulatory limitations, thereby placing the design constraints, the hardware limitations, and the regulatory limitations in a geometrically transformed coordinate space;
   (e) calculating, with the aid of the computer processor, a gradient waveform for each gradient dimension that simultaneously satisfies all of the design constraints, hardware limitations, and regulatory limitations in the geometrically transformed coordinate space;
   (f) determining, with the aid of the computer processor, whether each dimension of the gradient waveform meets an equal length condition of having the same time length as all other dimensions of the gradient waveform;
   (g) repeating steps (d), (e), and (f) with different geometric transformations at each iteration until the equal length condition of step (f) is satisfied, thereby generating the multi-dimensional gradient waveform; and
   (h) generating a magnetic field gradient pulse, with the MRI device, according to criteria of the multi-dimensional gradient waveform of step (g).

2. The method of claim 1, wherein the multi-dimensional gradient waveform generated encompasses two or three gradient axes, respectively corresponding to a plane or volume in Cartesian space.

3. The method of claim 1, wherein the set of design constraints further comprises one or more of a gradient area, a gradient first moment, or a higher order gradient moment.

4. The method of claim 1, wherein one or more of the maximum gradient amplitude or maximum gradient slew-rate limit is calculated as a peak or as a root-mean-square limit.

5. The method of claim 1, wherein the regulatory limitation is configured to limit induced tissue currents in the scan subject and minimize intolerable peripheral nerve stimulations in the scan subject.

6. The method of claim 1, wherein the regulatory limitation comprises an integrated maximum rate of change of a magnetic field (dB/dt) for the waveform on each physical axis or as a vector sum.

7. The method of claim 1, wherein the regulatory limitation comprises a maximum root-mean-square gradient slew rate.

8. The method of claim 1, wherein the one or more geometric transformations is a spatial rotation, with the spatial rotation comprising one or more of a planar rotation, a three-dimensional rotation, or a vector rotation.

9. The method of claim 8, wherein step (h) further comprises performing an inverse transformation of the multi-dimensional gradient waveform back into a native coordinate system of the MRI device.

10. The method of claim 1, wherein one or more geometric transformations is rotative, proportional, or an increase or decrease in magnitude.

* * * * *